(12) United States Patent
Xie et al.

(10) Patent No.: US 9,614,056 B2
(45) Date of Patent: Apr. 4, 2017

(54) METHODS OF FORMING A TRI-GATE FINFET DEVICE

(71) Applicant: GLOBALFOUNDRIES Inc., Grand Cayman (KY)

(72) Inventors: Ruilong Xie, Niskayuna, NY (US); Andreas Knorr, Wappingers Falls, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 106 days.

(21) Appl. No.: 14/525,288

(22) Filed: Oct. 28, 2014

(65) Prior Publication Data
US 2016/0118480 A1    Apr. 28, 2016

(51) Int. Cl.
| | |
|---|---|
| *H01L 29/76* | (2006.01) |
| *H01L 29/66* | (2006.01) |
| *H01L 29/78* | (2006.01) |
| *H01L 27/12* | (2006.01) |
| *H01L 21/84* | (2006.01) |
| *H01L 21/8234* | (2006.01) |
| *H01L 27/11* | (2006.01) |
| *H01L 21/8238* | (2006.01) |

(52) U.S. Cl.
CPC ...... *H01L 29/66795* (2013.01); *H01L 21/845* (2013.01); *H01L 27/1211* (2013.01); *H01L 29/785* (2013.01); *H01L 29/7841* (2013.01); *H01L 21/823412* (2013.01); *H01L 21/823431* (2013.01); *H01L 21/823807* (2013.01); *H01L 21/823821* (2013.01); *H01L 27/1104* (2013.01)

(58) Field of Classification Search
CPC .......... H01L 29/66795; H01L 29/785; H01L 21/823431; H01L 27/1211; H01L 29/7841; H01L 21/823412; H01L 21/823807; H01L 21/823821; H01L 21/845; H01L 27/1104
See application file for complete search history.

(56) References Cited

U.S. PATENT DOCUMENTS

| | | | |
|---|---|---|---|
| 2014/0084239 A1* | 3/2014 | Radosavljevic | .... H01L 29/0665 257/12 |
| 2014/0264280 A1* | 9/2014 | Kim | ...................... H01L 29/785 257/29 |

FOREIGN PATENT DOCUMENTS

WO    WO2014142952    * 9/2014

* cited by examiner

*Primary Examiner* — Duy T Nguyen
(74) *Attorney, Agent, or Firm* — Amerson Law Firm, PLLC

(57) ABSTRACT

One illustrative method disclosed herein includes, among other things, forming a fin that is positioned above and vertically spaced apart from an upper surface of a semiconductor substrate, the fin having an upper surface, a lower surface and first and second side surfaces, wherein an axis of the fin in a height direction of the fin is oriented substantially parallel to the upper surface of the substrate, and wherein a first side surface of the fin contacts a first insulating material, forming a gate structure around the upper surface, the second side surface and the lower surface of the fin, and forming a gate contact structure that is conductively coupled to the gate structure.

21 Claims, 31 Drawing Sheets

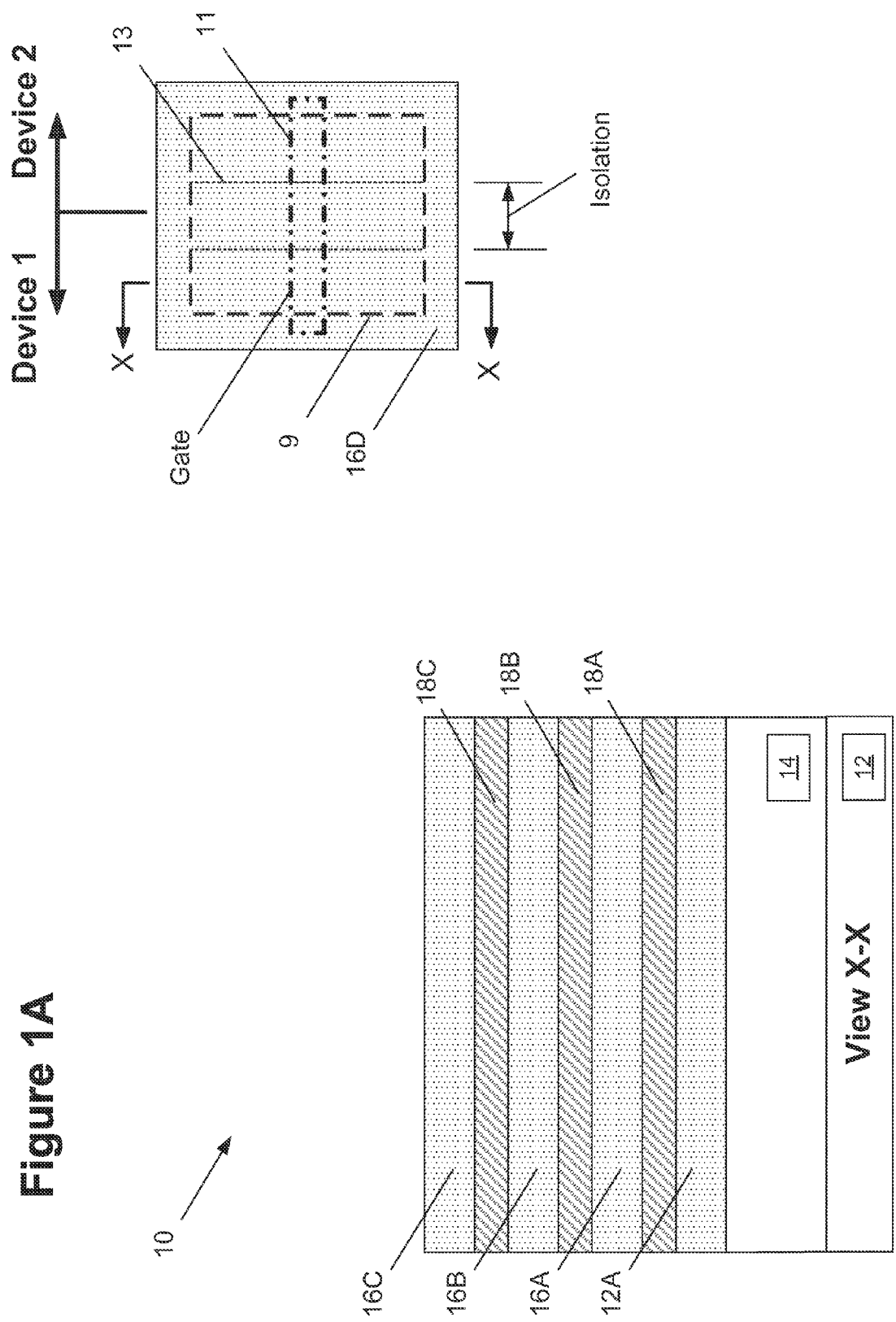

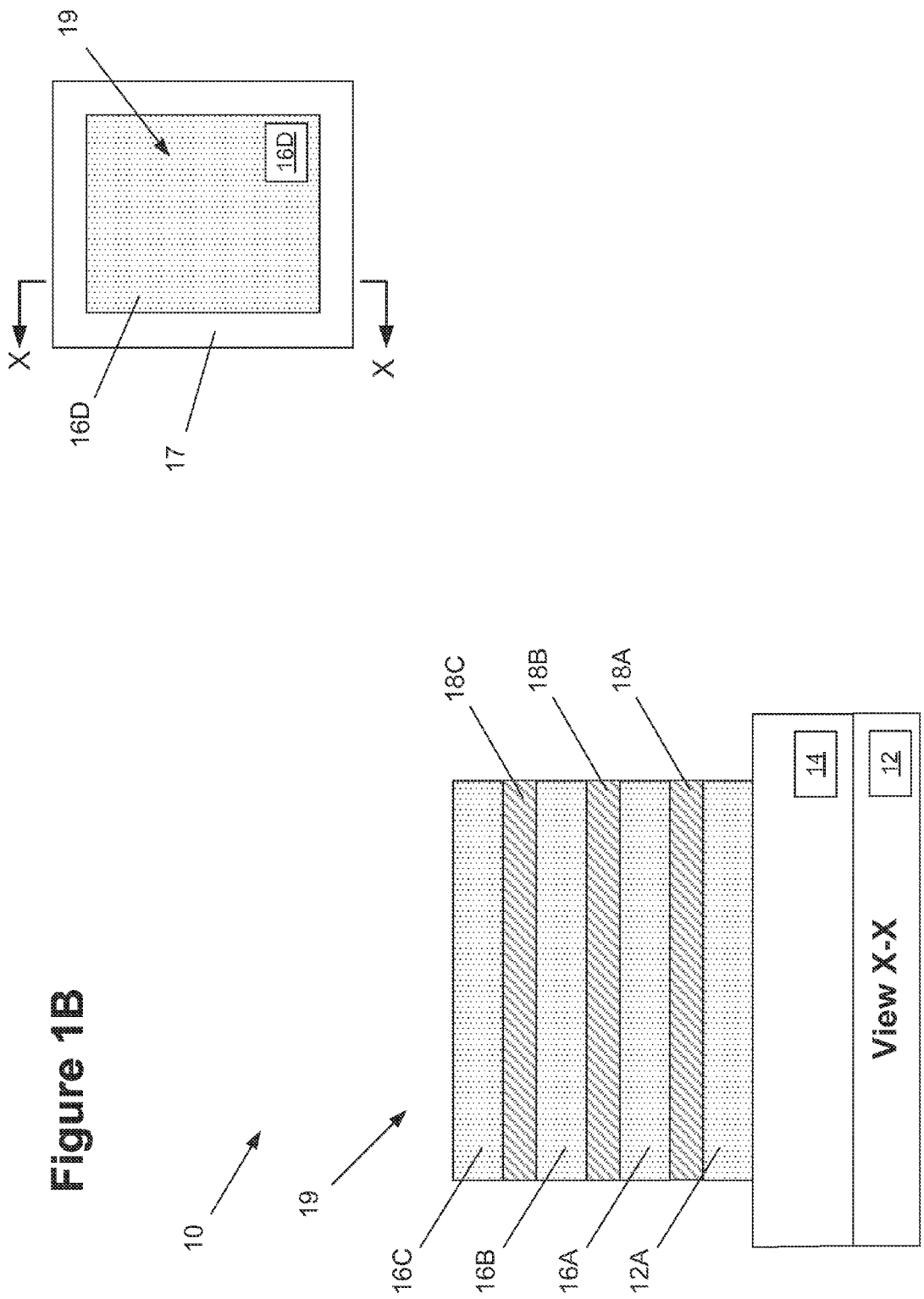

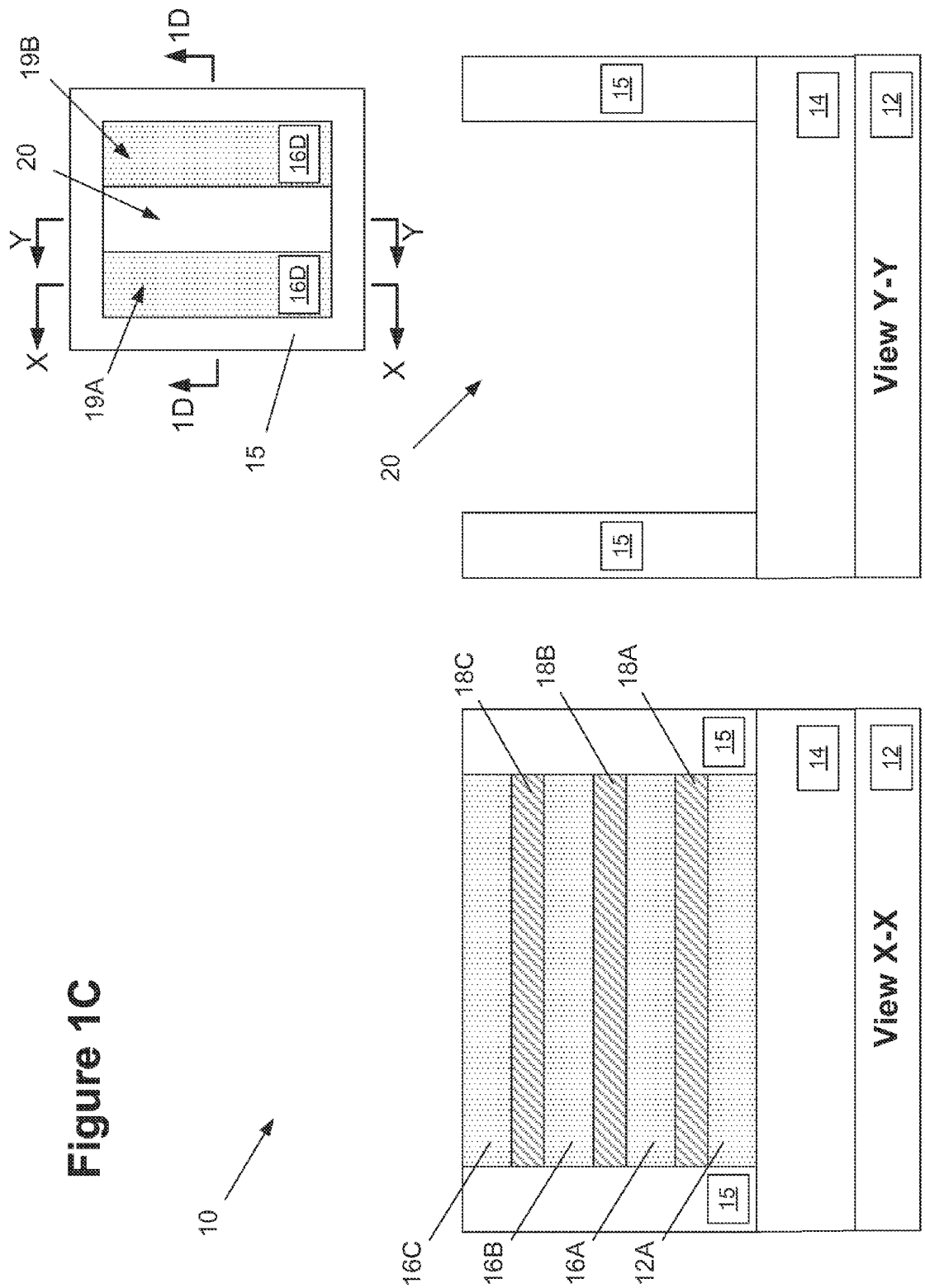

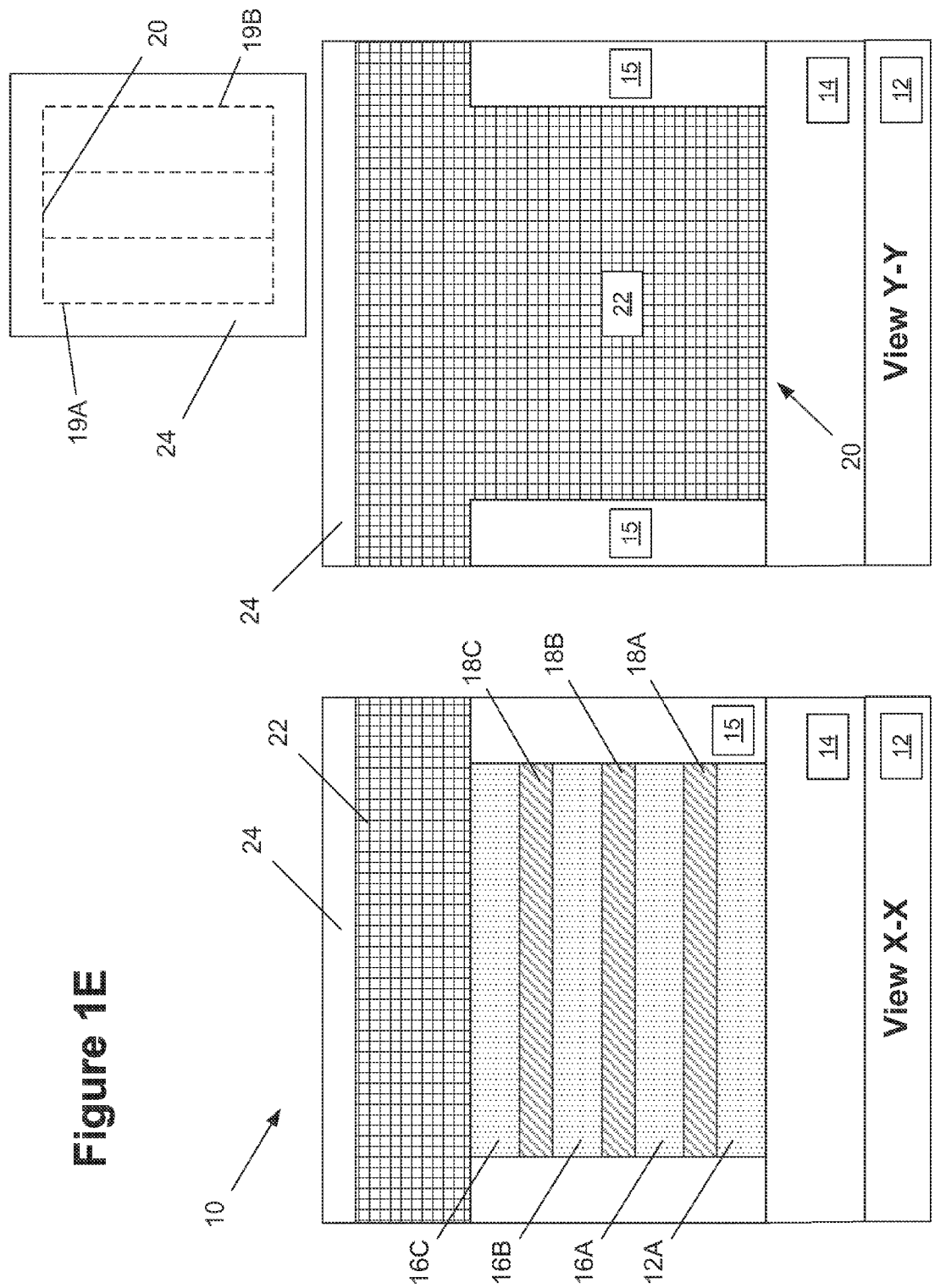

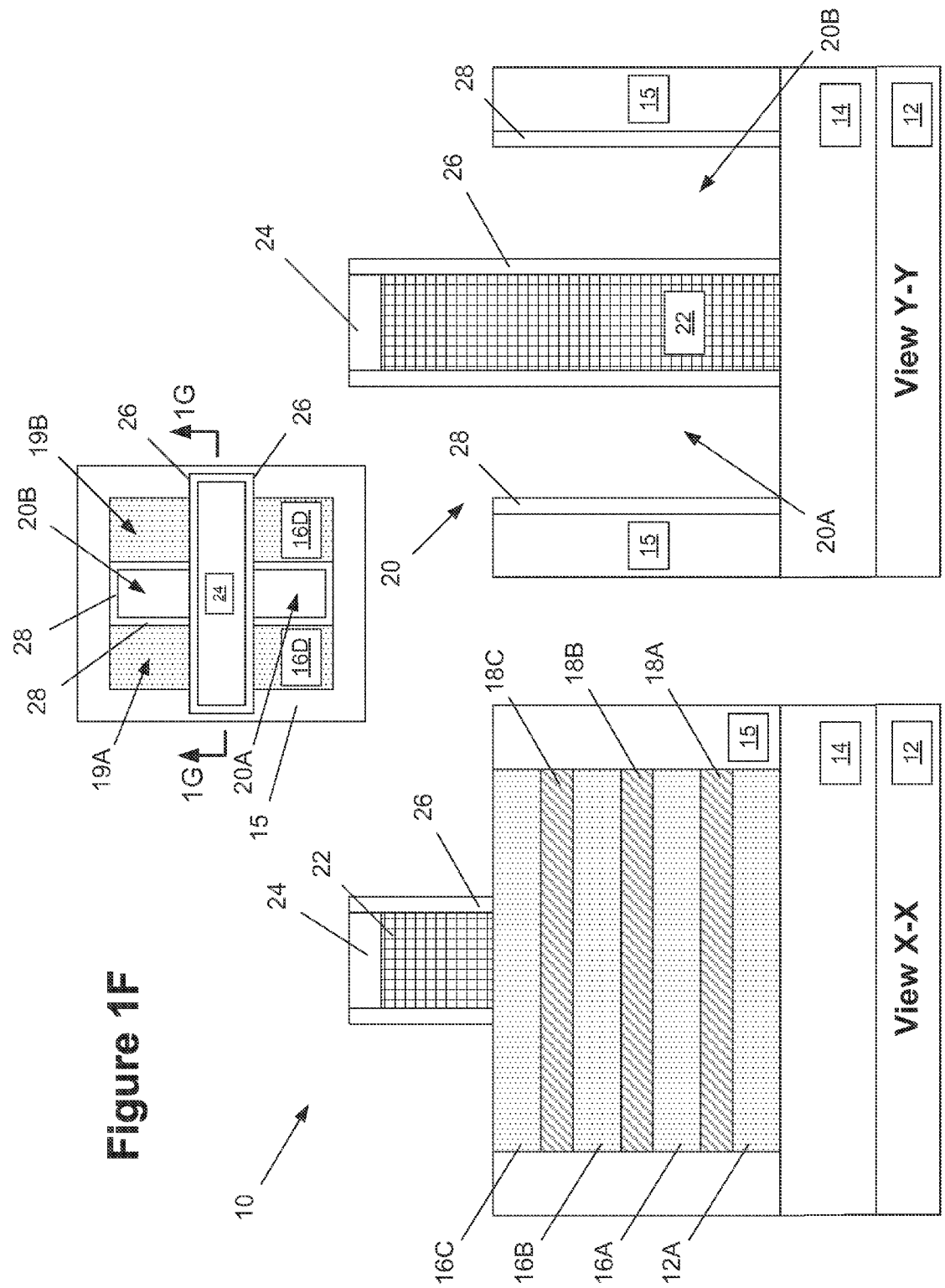

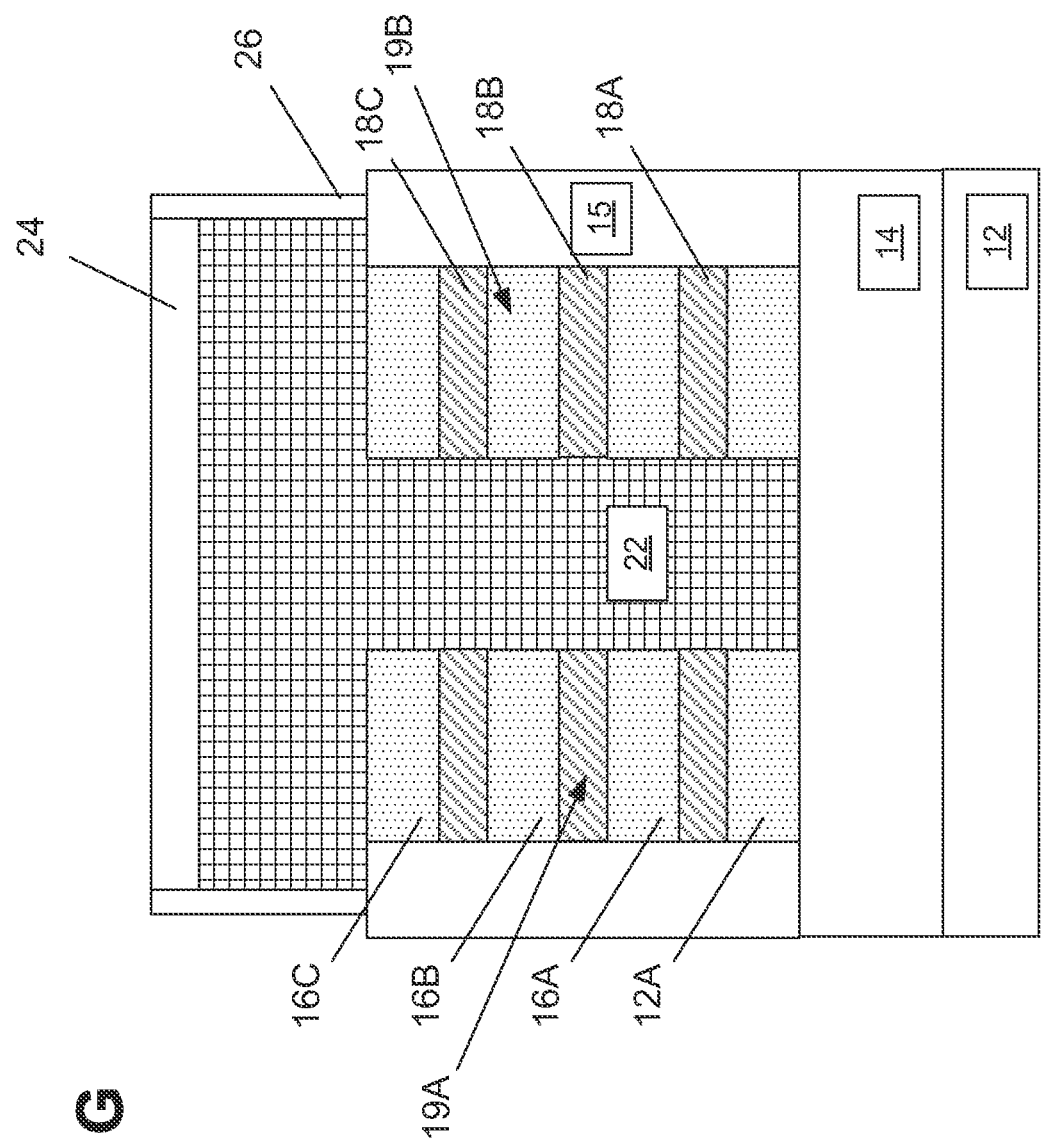

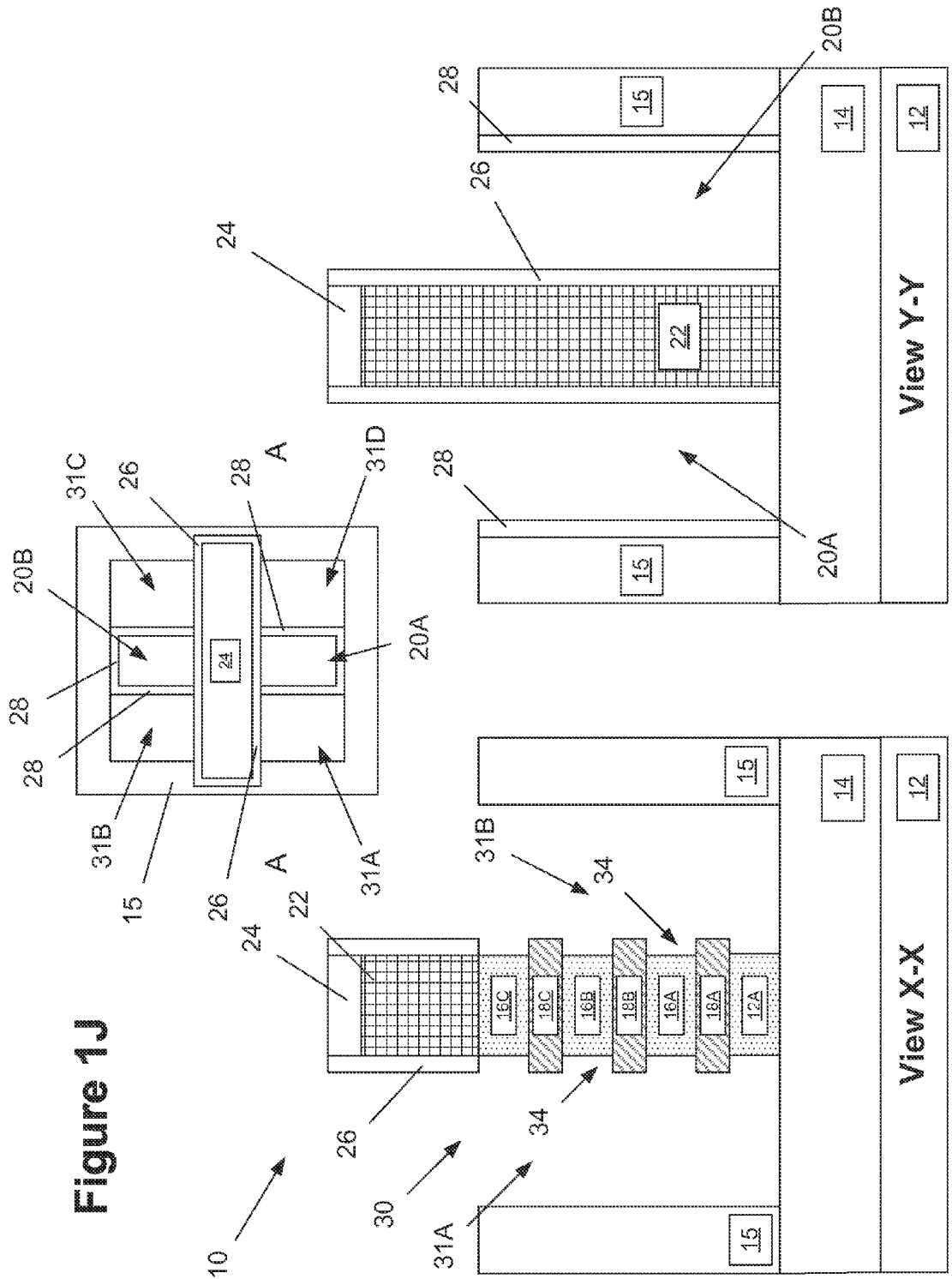

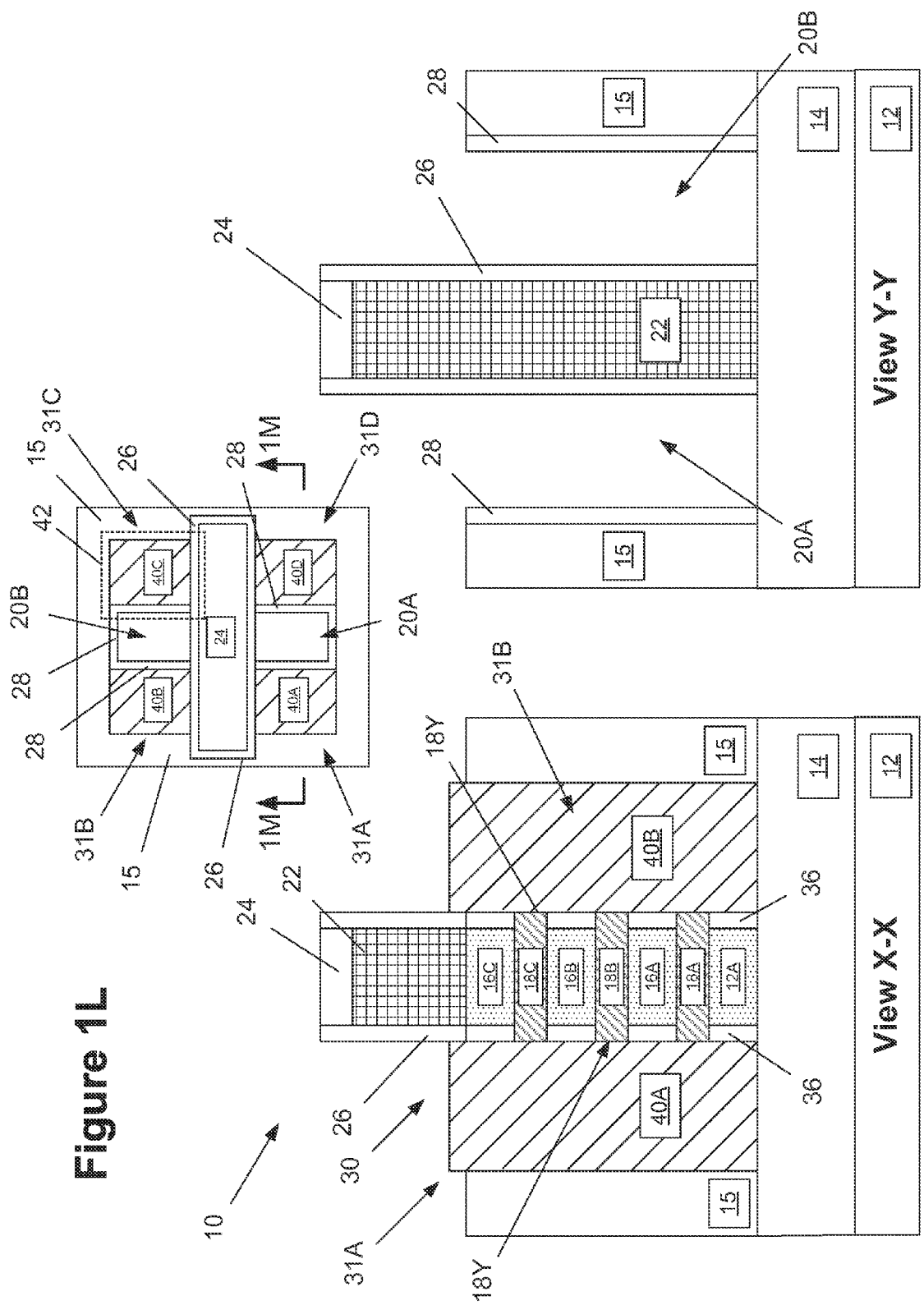

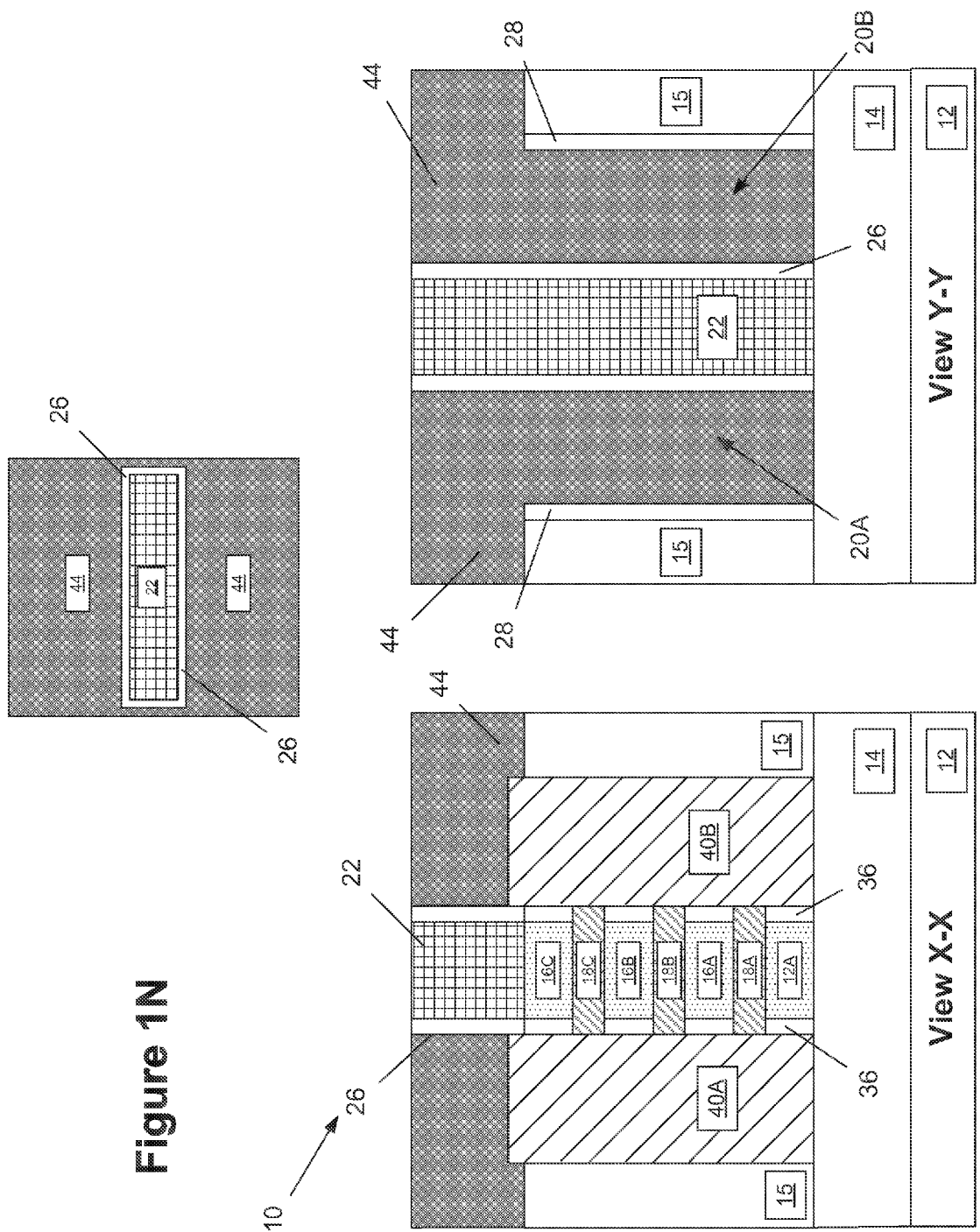

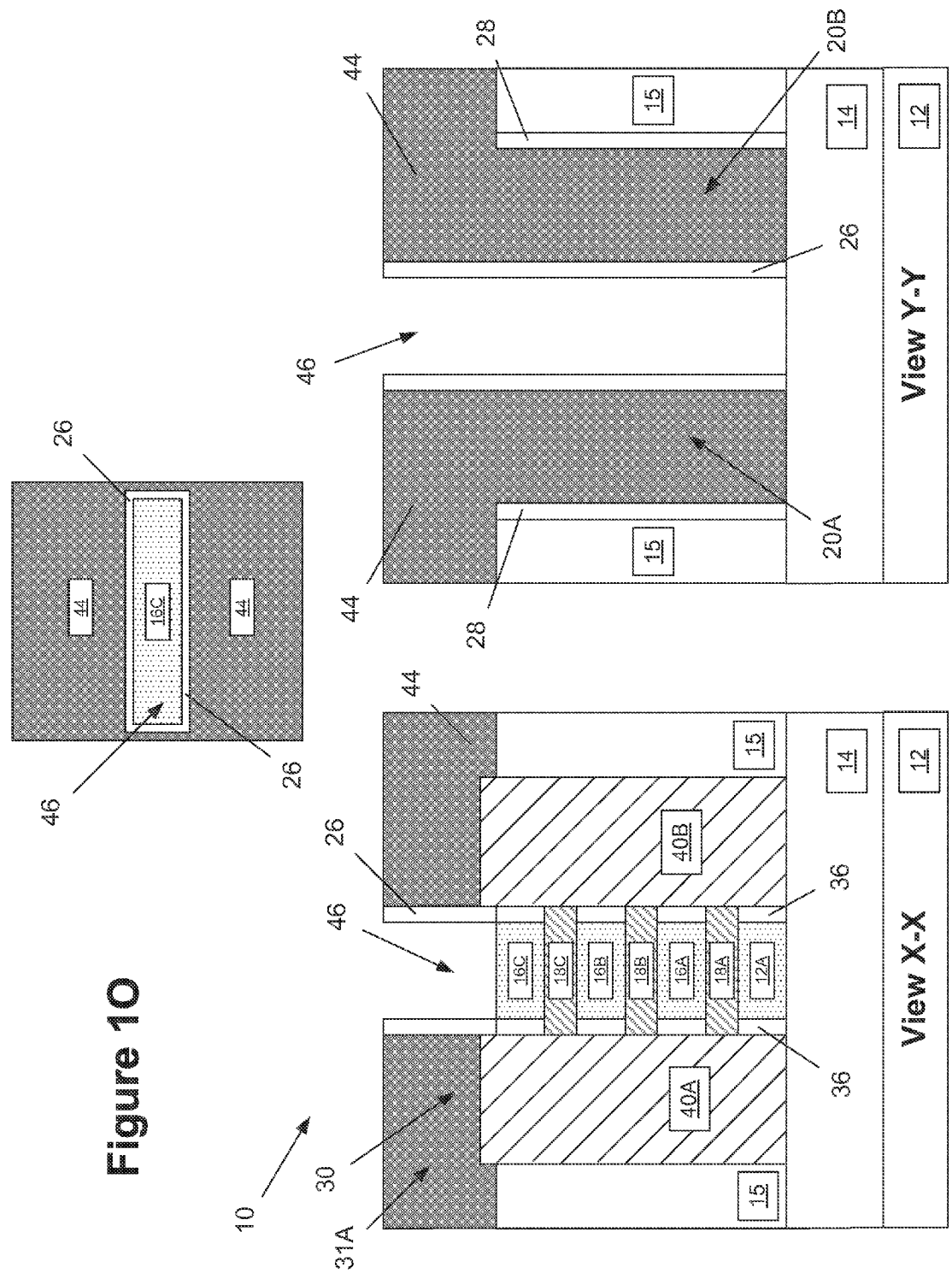

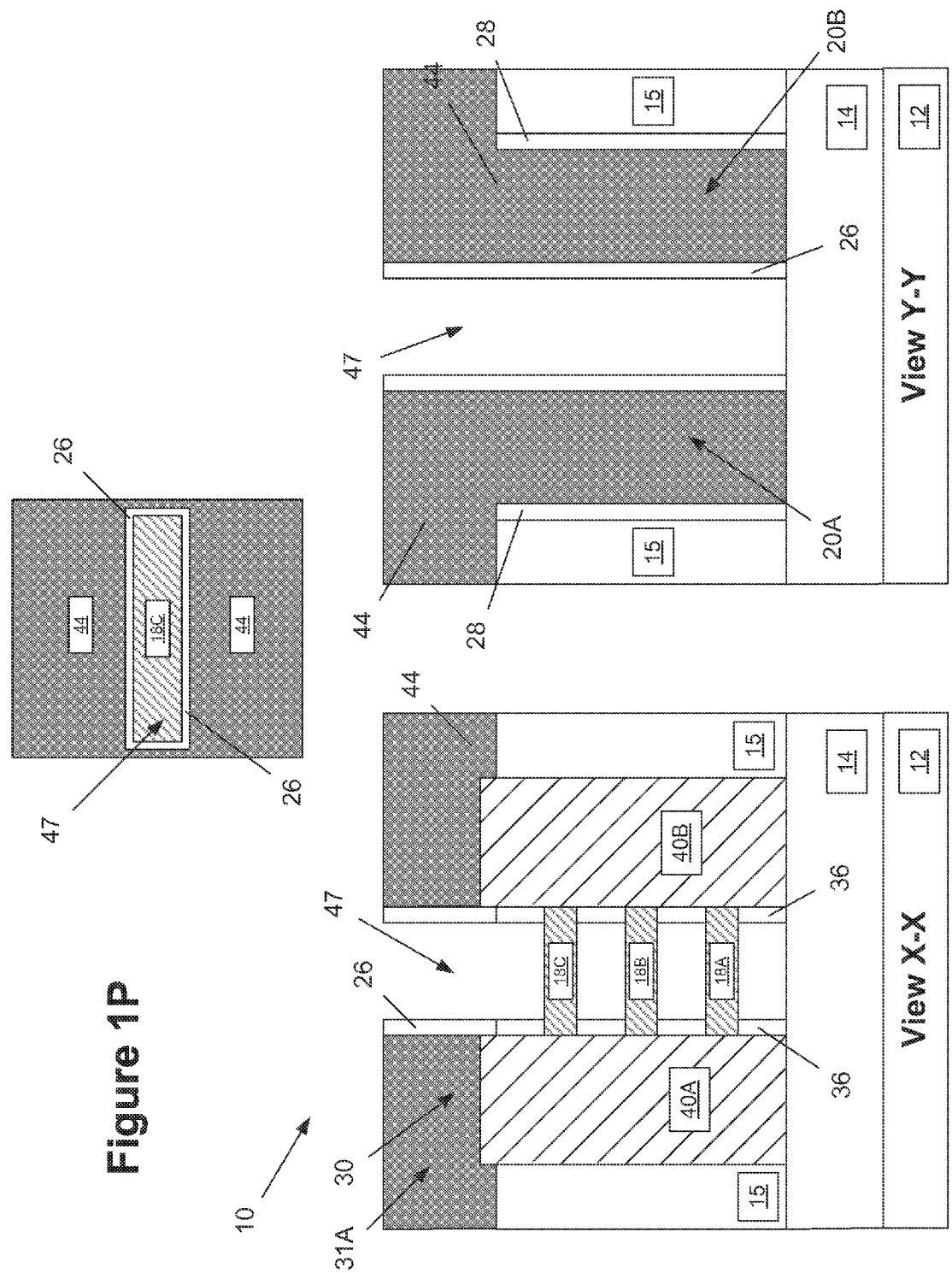

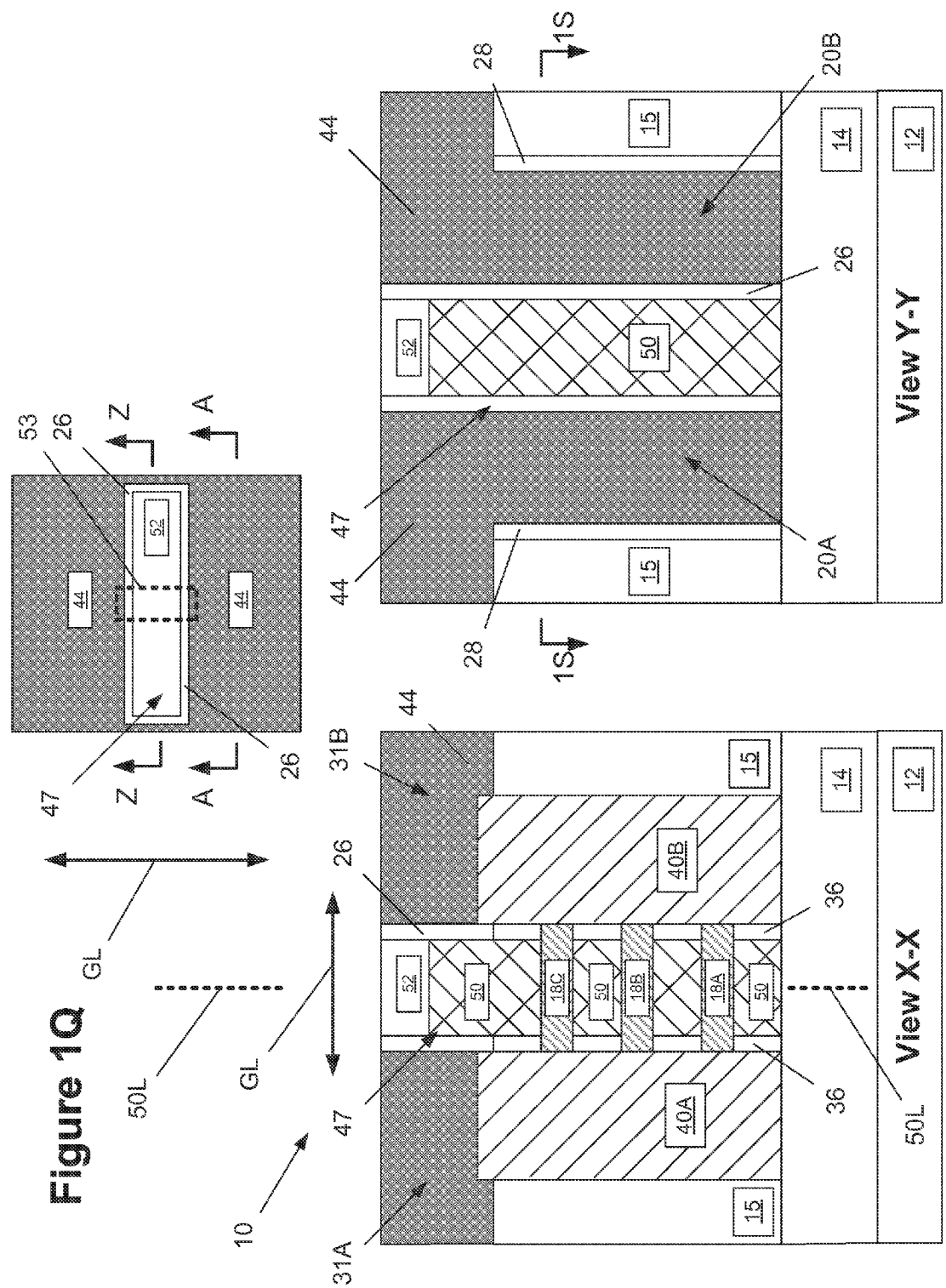

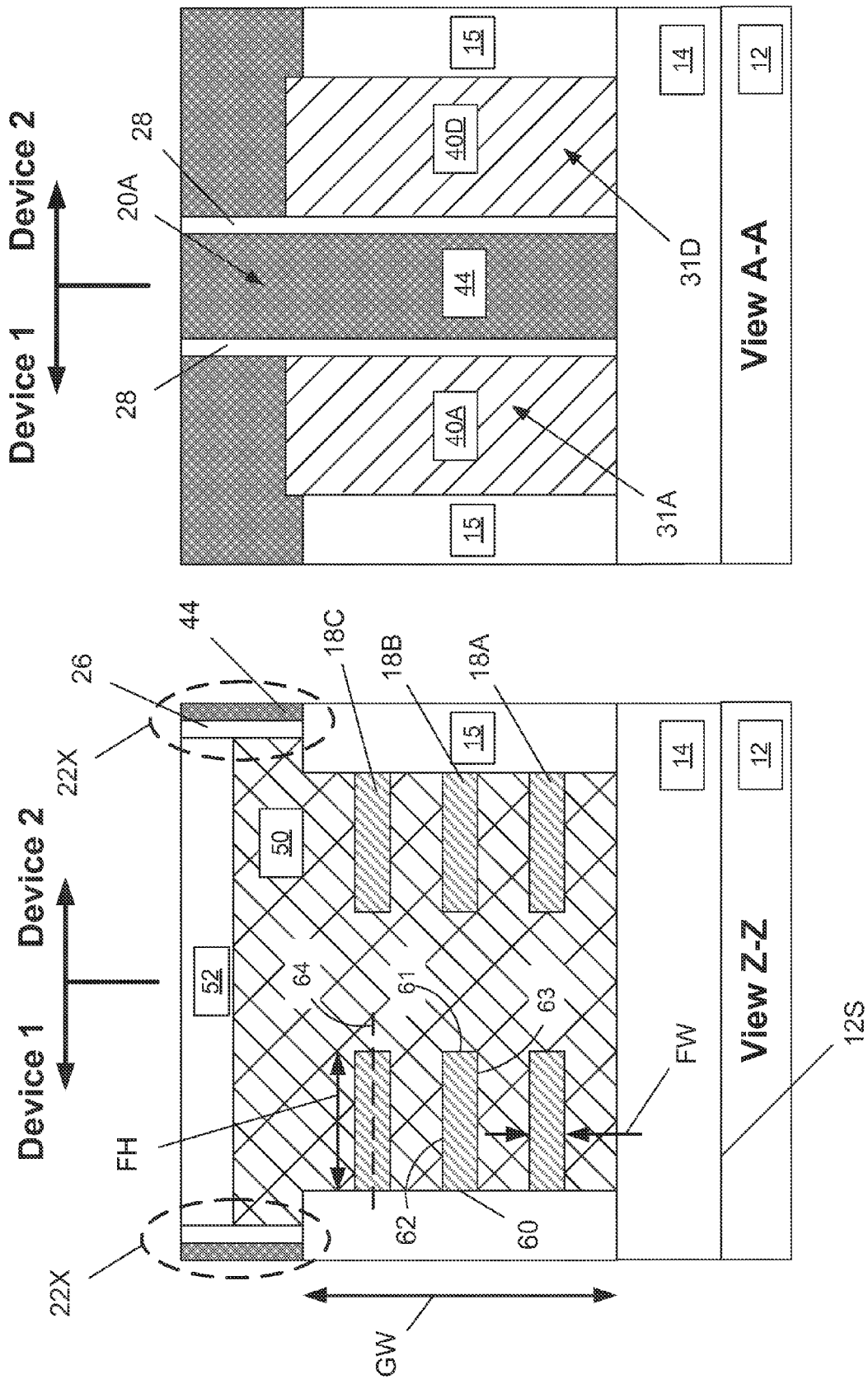

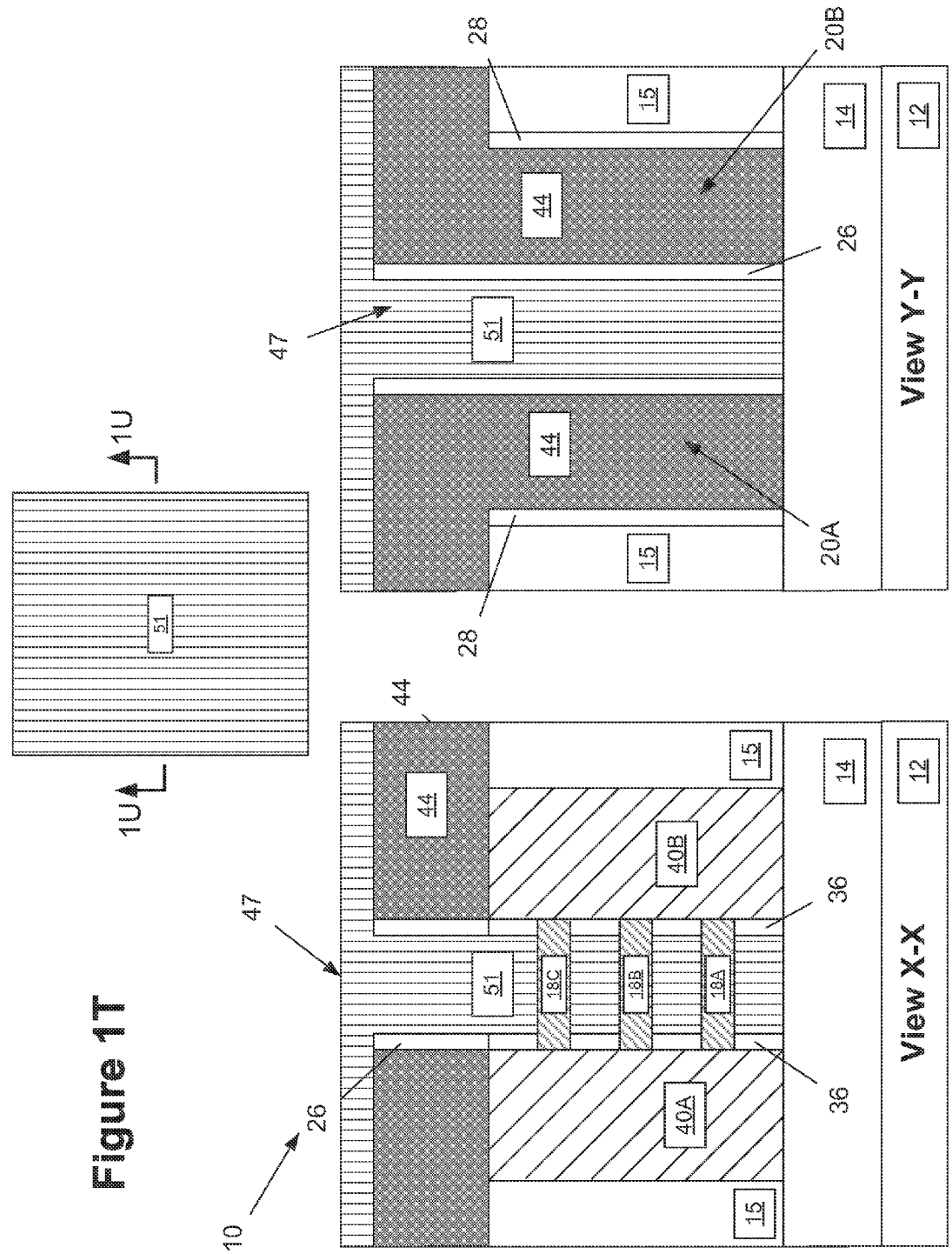

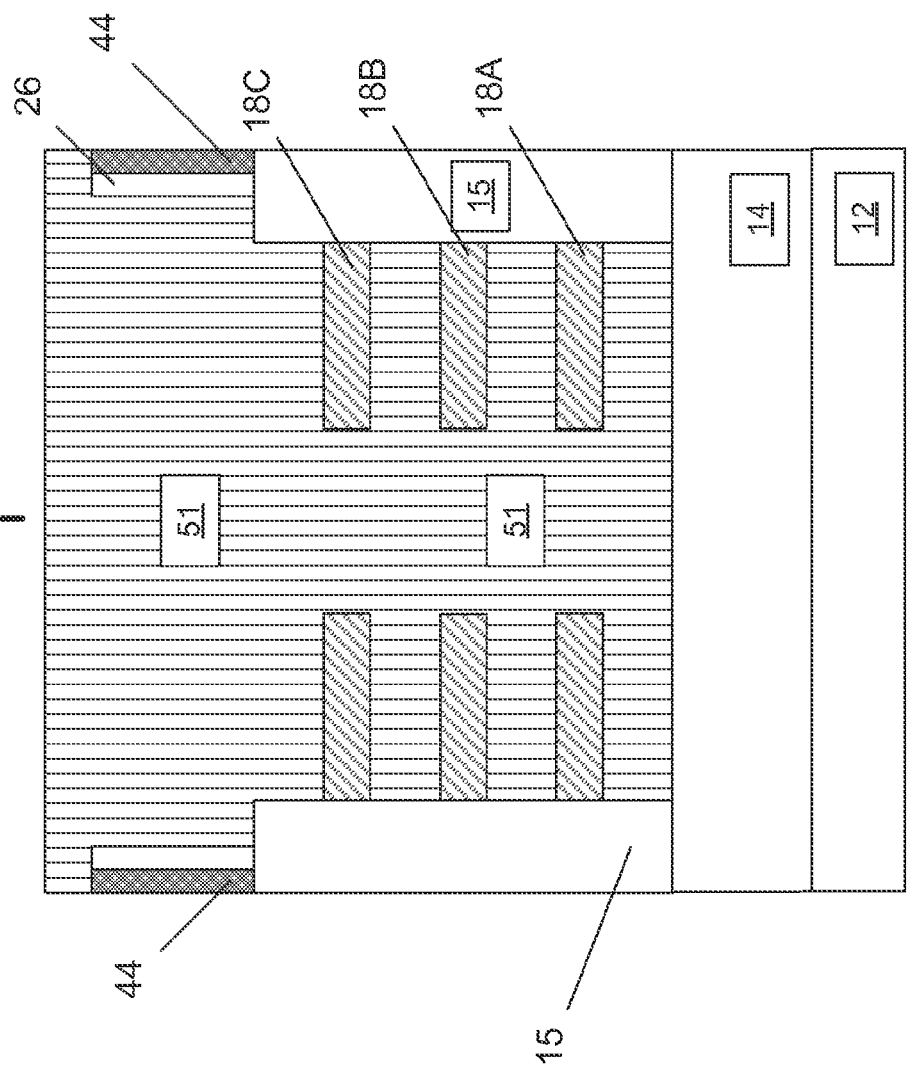

Figure 1V
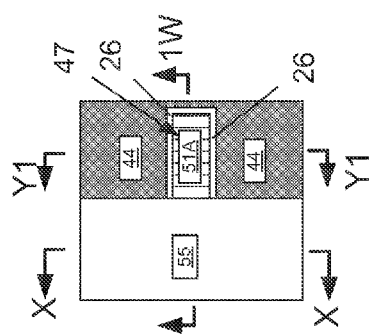
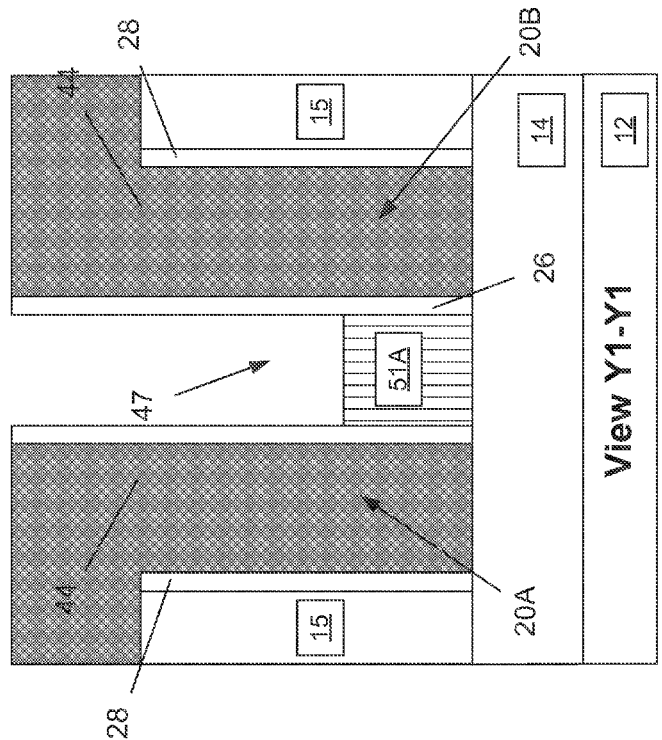
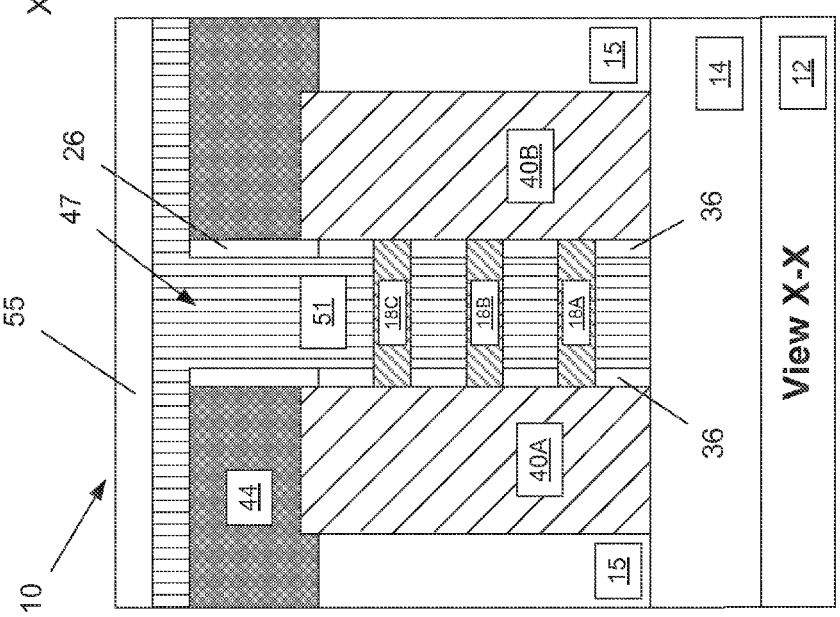

METHODS OF FORMING A TRI-GATE FINFET DEVICE

BACKGROUND OF THE INVENTION

1. Field of the Invention

Generally, the present disclosure relates to the manufacture of semiconductor devices, and, more specifically, to various novel methods of forming a tri-gate FinFET device and the resulting device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 3A is a perspective view of an illustrative prior art FinFET semiconductor device 100 that is formed above a semiconductor substrate 102 that will be referenced so as to explain, at a very high level, some basic features of a traditional FinFET device. In this example, the FinFET device 100 includes three illustrative fins 104, a gate structure 106, sidewall spacers 108 and a gate cap 110. The gate structure 106 is typically comprised of a layer of insulating material (not separately shown), e.g., a layer of high-k insulating material or silicon dioxide, and one or more conductive material layers (e.g., metal and/or polysilicon) that serve as the gate electrode for the device 100. The fins 104 have a three-dimensional configuration: a height 104H, a width 104W and an axial length 104L. The axial length 104L corresponds to the direction of current travel, i.e., the gate length (GL) of the device 100 when it is operational. The portions of the fins 104 covered by the gate structure 106 is the channel region of the FinFET device 100. In a conventional process flow, the portions of the fins 104 that are positioned outside of the spacers 108, i.e., in the source/drain regions of the device 100, may be increased in size or even merged together (a situation not shown in FIG. 3A) by performing one or more epitaxial growth processes. The process of increasing the size of or merging the fins 104 in the source/drain regions of the device 100 is performed to reduce the resistance of source/drain regions and/or make it easier to establish electrical contact to the source/drain regions. Even if an epi "merger" process is not performed, an epi growth process will typically be performed on the fins 100 to increase their physical size.

FIG. 3B depicts a simplistic plan view of the traditional FinFET device comprised of three illustrative fins 104. A cross-sectional view of the device 100 taken through the gate structure 106 is depicted in FIG. 3C. With reference to FIG. 3C, the device 100 includes a layer of insulating material 112 positioned between the fins 104, another layer of insulating material 114 that is positioned above the gate cap layer 110 and a gate contact structure 116 that is conductively coupled to the gate structure 106. The device 100 depicted in FIG. 3C is a tri-gate (or triple gate) FinFET device. That is, during operation, a very shallow conductive region 118 (shown only on the middle fin in FIG. 3C) will be established that provides a path or channel for current to flow from the source region to the drain region. The conductive region 108 forms inward of the side surfaces 104S and below the top surface 104T of the fins 104. As depicted in FIGS. 3B and 3C, the overall gate length (GL) of the FinFET device 100 and the overall gate width (GW) of the FinFET device 100 are all oriented in a direction that is substantially parallel to a horizontal surface 102A of the substrate 102.

While the traditional FinFET devices described above have significant advantages as compared to traditional planar devices, further improvement in such FinFET devices need to be made. For example, traditional FinFET devices still consume a significant amount of valuable plot space on a semiconductor substrate. Reducing the "foot-print" of such devices is becoming ever more difficult to achieve by simply reducing the critical dimensions of the various features of the device, e.g., the gate structure 106, the fin width 104W, etc. FIG. 4 is an illustrative example of a prior art logic device that is made by forming a plurality of traditional FinFET devices. More specifically, the logic device is comprised of a 4-fin P-type FinFET device, a 2-fin P-type FinFET device, a 6-fin N-type FinFET device and a 3-fin N-type FinFET device. Various gate structures, gate contacts and trench silicide source/drain contact structures are also depicted. In general, such an arrangement has a relatively large "foot-print" and results in some wasted space. Note the space between the 2-fin P-type FinFET device and the 3-fin N-type FinFET device. What is needed is a fundamentally new FinFET architecture that will reduce the footprint of a FinFET device and thereby reduce the footprint of integrated circuits that use such FinFET devices.

The present disclosure is directed to methods of forming a tri-gate FinFET device and the resulting device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a tri-gate FinFET device and the resulting device. One illustrative method disclosed herein includes, among other things, forming a fin that is positioned above and vertically spaced apart from an upper surface of a semiconductor substrate, the fin having an upper surface, a lower surface and first and second side surfaces, wherein an axis of the fin in a height direction of the fin is oriented substantially parallel to the upper surface of the substrate, and wherein a first side surface of the fin contacts a first insulating material, forming a gate structure around the upper surface, the second side surface and the lower surface of the fin, and forming a gate contact structure that is conductively coupled to the gate structure.

One example of a novel tri-gate FinFET device disclosed herein includes, among other things, a fin that is positioned vertically above and spaced apart from an upper surface of a semiconductor substrate, the fin having an upper surface, a lower surface and first and second side surfaces, wherein an axis of the fin in a height direction of the fin is oriented substantially parallel to the upper surface of the substrate, and wherein a first side surface of the fin contacts a first insulating material, a gate structure positioned around the upper surface, the second side surface and the lower surface of the fin, and a gate contact structure that is conductively coupled to the gate structure.

Also disclosed herein are various novel integrated circuit products. In one embodiment, the integrated circuit product includes at least first and second tri-gate FinFET devices wherein the fins) in each of the devices are positioned vertically above and spaced apart from a semiconductor substrate and the fins) have a height direction that is oriented substantially parallel to an upper surface of the substrate, wherein the height of the fins) in the first and second devices is different. In other embodiments, the number of fins in the first and second devices is different.

BRIEF DESCRIPTION OF THE DRAWINGS

The disclosure may be understood by reference to the following description taken in conjunction with the accompanying drawings, in which like reference numerals identify like elements, and in which.

Figure 1D:
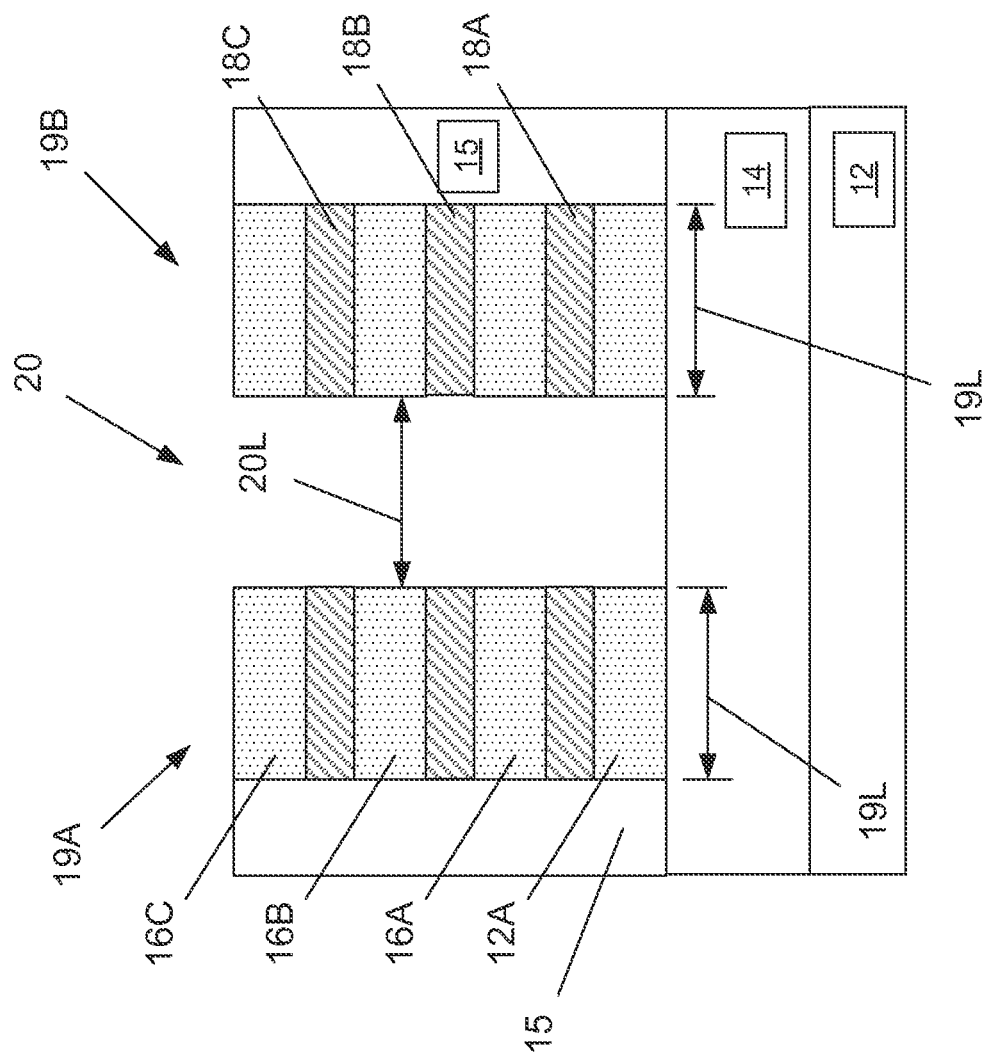
FIGS. 1A-1X depict various illustrative novel various novel methods of forming a tri-gate FinFET device and the resulting device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 10 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIG. 1A contains a cross-sectional view and a simplistic plan view of a plurality of illustrative tri-gate FinFET devices 10 ("Device 1" and "Device 2") that may be formed using the methods disclosed herein at an early stage of fabrication. The use of the terms Device 1 and Device 2 are purely for explanation purposes. As will be appreciated by those skilled in the art after reading the present application, "Device 1" and "Device 2" may actually be a single device with a longer channel width. The tri-gate FinFET devices 10 will be formed in the dashed-line region 9 depicted in the simplistic plan view. An isolation region or material will be formed between the dashed lines 13 to separate the two devices. A gate structure, represented by the dashed-line region 11, will be formed across both of the tri-gate FinFET devices 10. The view "X-X" is a cross-sectional view taken through Device 1 in a gate length direction of Device 1, i.e., in the current transport direction of Device 1 when it is operational. A cross-sectional view "Y-Y" (see FIG. 1C) is a cross-section taken through the region where the isolation material will be formed in a direction that is parallel to the X-X direction. Additional cross-sectional views will be taken where indicated in the drawings.

FIG. 1A depicts the tri-gate FinFET devices 10 at an early stage of fabrication wherein several process operations have already been performed. In general, the tri-gate FinFET devices 10 will be formed in and above a semiconductor substrate. The substrate may have a variety of configurations, such as a silicon-on-insulator (SOI) or silicon-germanium-on-insulator (SGOI) that includes a bulk semiconductor layer, a buried insulation layer and an active layer. Alternatively, the substrate may have a bulk configuration. The substrate may be made of silicon or it may be made of materials other than silicon. Thus, the terms "substrate" or "semiconductor substrate" should be understood to cover all semiconducting materials and all forms of such materials. In the examples depicted herein, the substrate is depicted as being a silicon-germanium-on-insulator substrate with a bulk layer 12, a buried insulation layer 14 and an active layer 12A comprised of silicon germanium, with a germanium composition of about 25% or more. The thickness of the active layer 12A may vary depending upon the particular application.

With continuing reference to FIG. 1A, the tri-gate FinFET devices 10 are depicted after a plurality of alternating semiconductor material layers 16A-16C (generally referred to with the reference number 16) and 18A-C (generally referred to with the reference number 18) were sequentially deposited above the active layer 12A. In general, the alternating semiconductor material layers 16 and 18 should be made of semiconductor materials that may be selectively etched relative to one another. For example, in one illustrative embodiment, the layers 16 may be comprised of silicon germanium and the layers 18 may be comprised of silicon. The number of layers 16 and 18 formed may vary depending upon the number of fins for the tri-gate FinFET devices 10. The thickness of the layers 14, 16 and 18 may vary depending upon the particular application. In one illustrative embodiment, the layer of insulating material 14 may have a thickness of about 10-1000 nm, the active layer 12A may have a thickness of about 5-30 nm, the layers 16 of silicon germanium may have a thickness of about 5-30 nm, and the layers 18 of silicon may have a thickness of about 5-15 nm. Of course, all of the layers 16 need not have the same thickness, and all of the layers 18 need not have the same thickness, although such may be the case in some applications. The layers 16 and 18 may be formed by performing a CVD or epitaxial deposition process. In general, the number of the layers 18 corresponds to the number of stacked fins for each of the devices 10. In some applications, it may be desirable to form FinFET devices with different numbers of fins, e.g., 3-fin devices in one region and 4-fin devices in another region of the substrate. As will be appreciated by those skilled in the art after a complete reading of the present application, the formation of different numbers of fins in different regions may be accomplished by the formation of the number of layers corresponding to the maximum number of fins in any one region above all regions of the substrate, and thereafter, using masking and etching techniques, removing the extra material(s) in regions where a lesser number of fins are to be formed.

FIG. 1B depicts the tri-gate FinFET devices 10 after one or more etching processes were performed through a patterned masking layer (not shown) to pattern the layers 16, 18 and the active layer 12A so as to thereby define a stack 19 of alternating semiconductor materials. The process operation exposes the buried insulation layer 14. In the example depicted herein, a plurality of anisotropic etching processes were performed to define the stack of materials 19. The physical size of the stack of materials 19 may vary depending upon the particular application and/or a variety of different considerations and factors. For example, the physical size of the stack of materials 19 may vary depending upon the desired width of the isolation material and the desired number of fins of the device(s) 10, etc. As described more fully below, portions of the layers 18 will become a stacked-fin arrangement that is positioned under the gate structure of the devices.

FIG. 1C depicts the tri-gate FinFET devices 10 after several process operations were performed. First, another layer of insulating material 15, e.g., silicon dioxide, was blanket-deposited above the stack of materials 19. Then, a CMP process was performed on the layer of insulating material 15 to planarize its upper surface with the upper surface of the stack of materials 19. Next, the stack of materials 19 was patterned to define first and second stacks 19A, 19B of alternating semiconductor materials with a space 20 therebetween. The stack of materials 19 was patterned by performing one of more etching processes through a patterned masking layer (not shown), e.g., a patterned layer of photoresist. The lateral width 19L (FIG. 1D) of the patterned stacks 19A, 19B as well as the lateral width 20L (FIG. 1D) of the space 20 for the isolation material may vary depending upon the particular application. FIG. 1C also depicts the tri-gate FinFET devices 10 after the patterned masking layer was removed. FIG. 1D is a cross-sectional view taken where indicated in the plan view of FIG. 1C, i.e., in a region where the gate structure for the tri-gate FinFET devices 10 will be formed (in a direction normal to the direction of current transport in the devices 10).

The inventions disclosed herein will be disclosed in the context of forming gate structures for the tri-gate FinFET devices 10 by performing a replacement gate process. Accordingly, FIG. 1E depicts the devices 10 after materials for a sacrificial gate structure 22 are formed above both of the tri-gate FinFET devices 10. The sacrificial gate structure 22 is intended to be representative in nature of any type of sacrificial gate structure that may be employed in manufacturing integrated circuit products using so-called gate-last (replacement gate) manufacturing techniques. In general, the sacrificial gate structure 22 is comprised of a sacrificial gate insulation layer (not separately shown), such as silicon dioxide, and a sacrificial gate electrode (not separately shown), such as polysilicon or amorphous silicon. Also depicted is an illustrative gate cap layer 24 (e.g., silicon nitride). FIG. 1E depicts the devices 10 after the layers of material for the sacrificial gate structure 22 and the gate cap layer 24 were formed/deposited above the patterned material stacks 19A, 19B and in the opening or space 20.

FIGS. 1F and 1G depict the tri-gate FinFET devices 10 after several process operations were performed. FIG. 1G is a cross-sectional view taken where indicated in the plan view of FIG. 1F. First, the materials of the sacrificial gate structure 22 and the gate cap layer 24 were patterned by performing one or more etching processes through a patterned etch mask (not shown), such as a patterned layer of photoresist, to define the sacrificial gate structure 22 and the gate cap layer positioned thereabove. See FIG. 1F (view Y-Y) and FIG. 1G. Thereafter, the patterned masking layer was removed. Then, sidewall spacers 26 were formed adjacent the patterned sacrificial gate structure 22 and sidewall spacers 28 were formed adjacent the exposed portions of the material stacks 19A, 19B and on the sidewalls of the insulation material 15 exposed by the opening 20. The spacers 26, 28 were formed by depositing a layer of spacer material and thereafter performing an anisotropic etching process. These process operations effectively separate the opening 20 into two separate openings 20A, 20B.

Figure 1H:
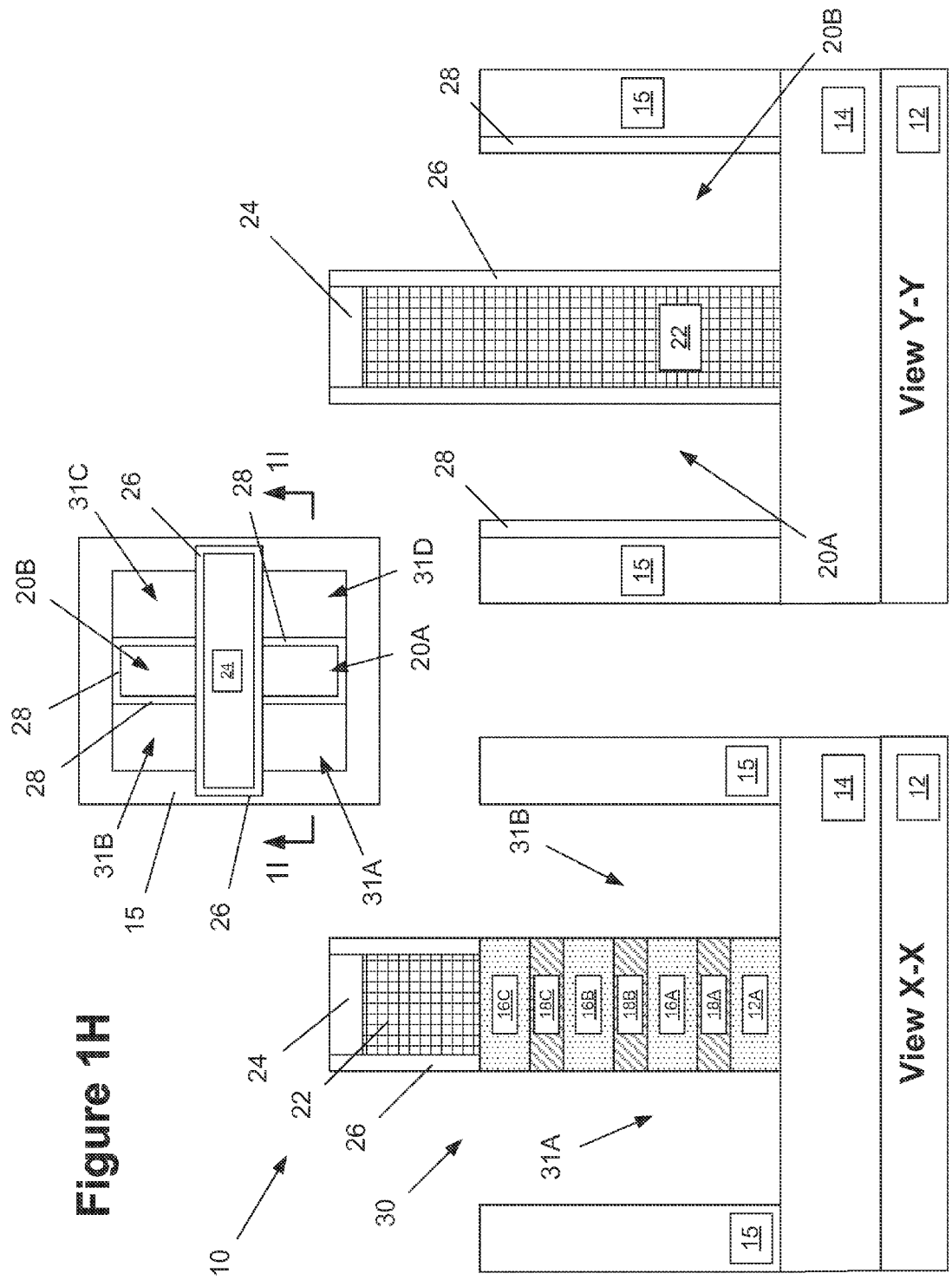
Figure 11:
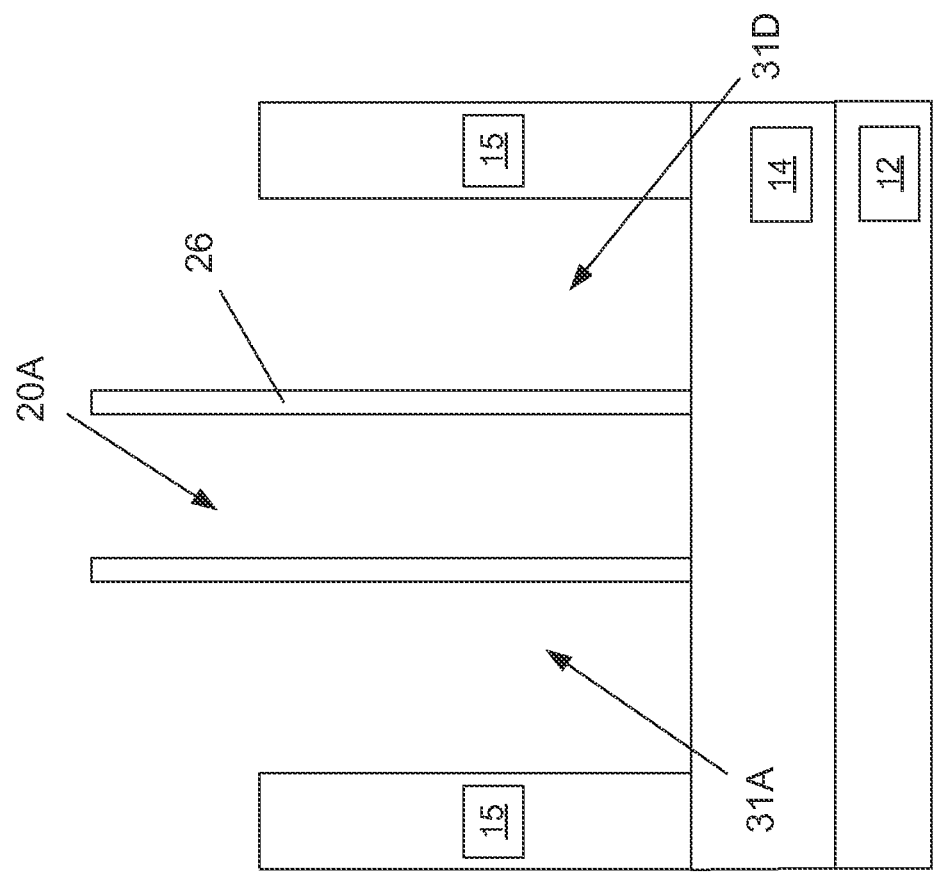

The next process operation will be described with reference to FIGS. 1H and 1I. FIG. 1I is a cross-sectional view taken where indicated in the plan view of FIG. 1H, i.e., through the source/drain region of the device. As depicted in these drawings, the portions of the first and second stacks 19A, 19B of alternating semiconductor materials that are not covered by the overall gate structure, i.e., by the gate cap layer 24 and the sidewall spacers 26, are removed by performing one or more etching processes using the overall gate structure as an etch mask. This results in the formation of another stack 30 of alternating semiconductor materials that are positioned under the sacrificial gate structure and the formation of a plurality of cavities 31A-31D (generally referenced with the number 31) that are regions where source/drain regions will eventually be formed for the devices 10. The cavities 31A-B are for Device 1, while the cavities 31C-D are for Device 2.

FIG. 1J depicts the tri-gate FinFET devices 10 after a brief recess etching process was performed on the stack of materials 30 to selectively remove a small lateral amount, e.g., 5-15 nm on each side, of the semiconductor materials 16 and the active layer 12A relative to the semiconductor materials 18. This results in the formation of small recesses or divots 34 in the stack of materials 30.

Figure 1K:
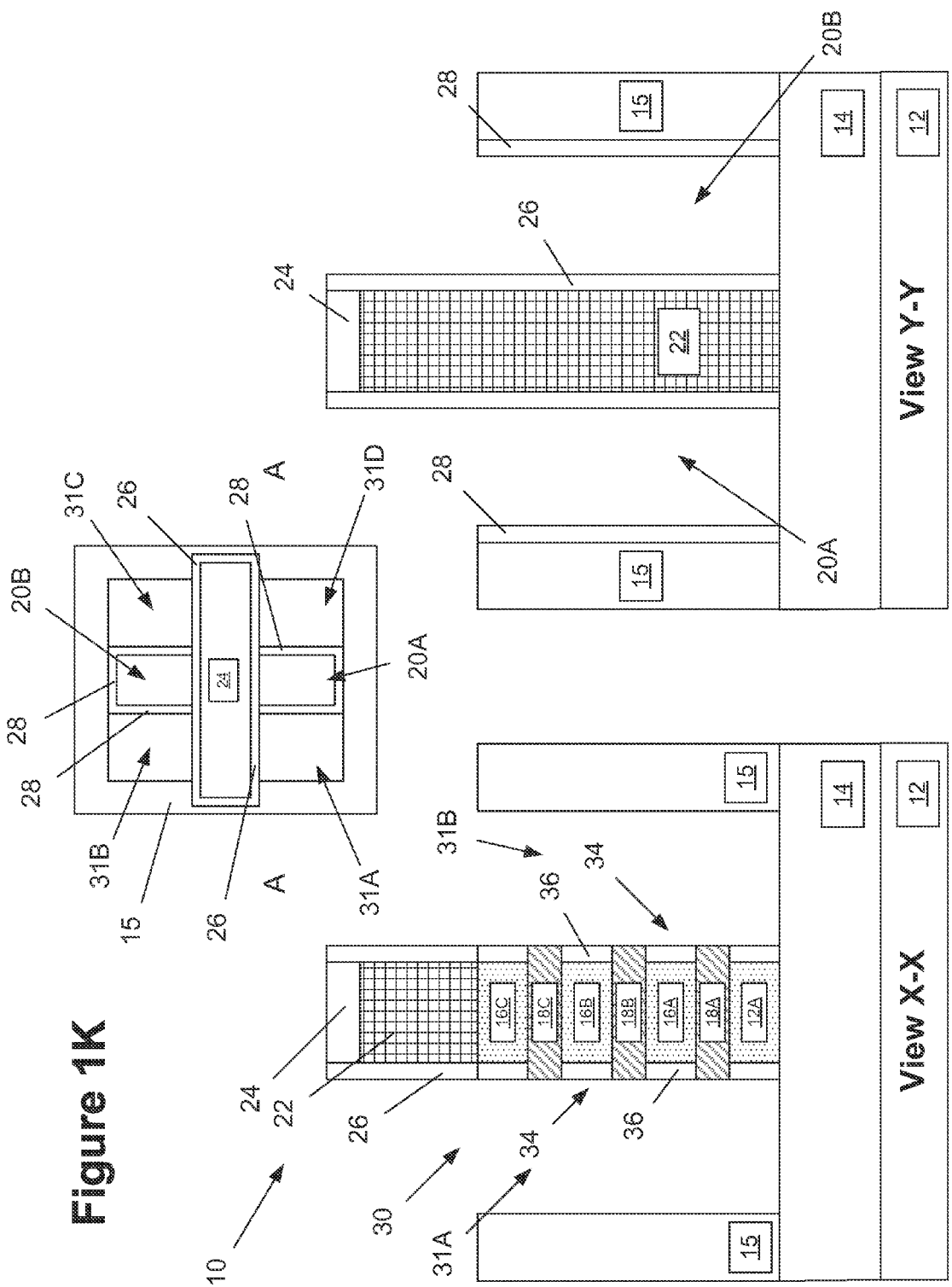

FIG. 1K depicts the tri-gate FinFET devices 10 after the recesses 34 in the stack of materials 30 were filled with an insulating material 36, e.g., silicon nitride. The insulating material 36 may be formed by performing a very brief deposition process so as to over-fill the recesses 34, and thereafter performing a brief anisotropic or isotropic etching process so as to leave the material 36 only positioned in the recesses 34.

Figure 1M:
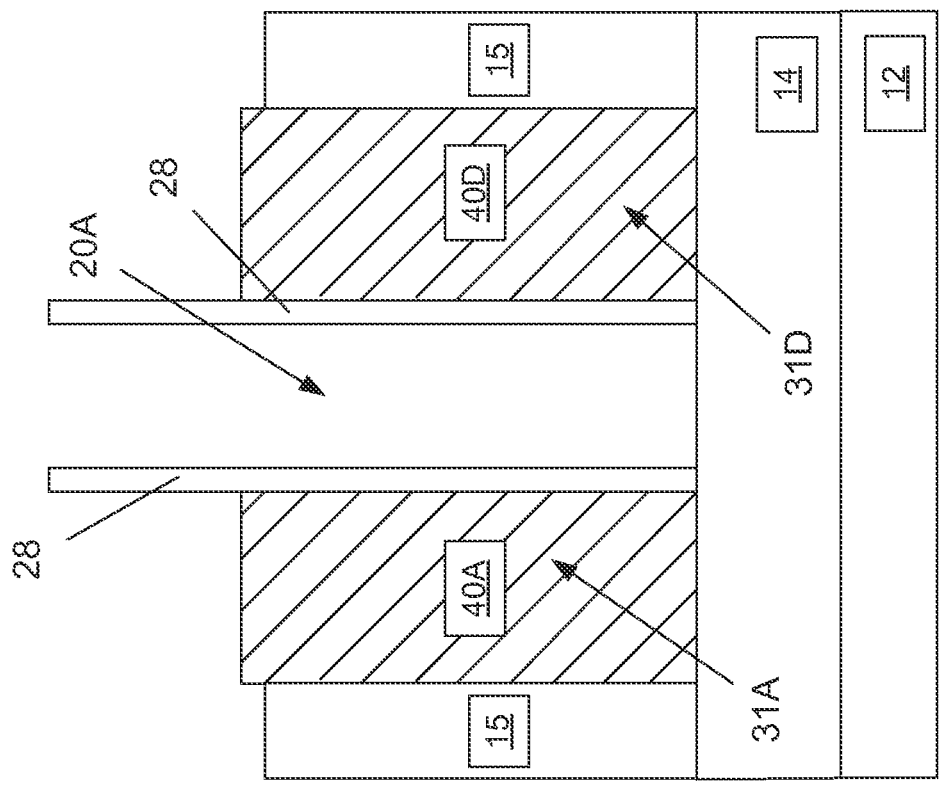

The next process operation will be described with reference to FIGS. 1L and 1M. FIG. 1M is a cross-sectional view taken where indicated in the plan view of FIG. 1L. As depicted in these drawings, one or more epitaxial deposition processes are performed to form epitaxial semiconductor material regions 40A-D (generally referenced with the number 40) in the cavities 31A-D, respectively. During the epitaxial deposition process, the exposed sidewalls 18Y of the semiconductor materials 18 act as "template" material(s) for the formation of the epi semiconductor material 40. The epi semiconductor material 40 may be doped with the appropriate dopants in situ during the epi formation process or they may be doped later via ion implantation. The epi semiconductor material 40 may be made of any desired semiconductor material or materials. As depicted in the dashed-line region 42 in the plan view in FIG. 1L, during the formation of the epi semiconductor materials 40, the growth of epi material is fully contained by the sidewall spacers 28 formed adjacent the openings 20A, 20B, the sidewall spacers 26 formed adjacent the gate structure and the insulating material 15, thereby preventing the formation of epi semiconductor material 40 in undesired locations.

The next process operation will be described with reference to FIG. 1N. As shown therein, another layer of insulating material 44, such as silicon dioxide, was formed so as to overfill the spaces 20A, 20B. Thereafter, one or more chemical mechanical polishing (CMP) processes were performed to planarize the upper surface of the insulating material 44 with the upper surface of the sacrificial gate structure 22 so as to remove the gate cap layer 24 and expose the sacrificial gate structure 22 for removal.

FIG. 1O depicts the devices 10 after one or more etching processes were performed to remove the sacrificial gate structure 22, which results in the formation of a cavity 46. The cavity 46 is laterally defined by the spacers 26. The process operation exposes the material stack 30, and in particular, the layer 16C.

FIG. 1P depicts the tri-gate FinFET devices 10 after one or more etching processes were performed through the cavity 46 on the stack of materials 30 to selectively remove the remaining portions of the semiconductor materials 16 and the active layer 12A relative to the semiconductor materials 18 and the insulating material 36. This results in the formation of a replacement gate cavity 47. The replacement gate cavity 47 is laterally defined by the spacers 26 and the insulating material 36. A final replacement gate structure for the devices 10 will be formed in the replacement gate cavity 47.

The next process operation will be described with reference to FIGS. 1Q and 1R. FIG. 1R contains cross-sectional views (Z-Z and A-A) taken where indicated in the plan view of FIG. 1Q. As shown in these drawings, the next major operation involves formation of a replacement gate structure 50 and a gate cap layer 52 (e.g., silicon nitride) in the replacement gate cavity 47. The replacement gate structure 50 depicted herein is intended to be representative in nature of any type of replacement gate structure that may be employed in manufacturing integrated circuit products. Typically, a pre-clean process will be performed in an attempt to remove all foreign materials from within the replacement gate cavity 47 prior to forming the various layers of material that will become part of the replacement gate structure 50. Thereafter, the final gate structure 50 may be formed by sequentially depositing the materials of the gate structure into the replacement gate cavity 47 and above the layer of insulating material 14 and then performing a CMP process to remove excess materials above the layer of insulating material 44. Thereafter, one or more recess etching processes were performed to recess the gate materials for the final gate structures 50. The amount of such recessing of the gate materials may vary depending upon the particular application. Then, the gate cap layer 52 was formed in the replacement gate cavity 47 above the recessed gate materials. The gate cap layer 52 may be comprised of a variety of materials, e.g., silicon nitride, and it may be formed by overfilling the remaining portions of the replacement gate cavity 47 with the gate cap material and thereafter performing a CMP process to remove excess materials. The overall gate length direction (GL) and the overall gate width direction (GW) of the devices are indicated in these drawings. In the examples depicted herein, each of the tri-gate FinFET devices 10 is comprised of three illustrative fins made from the semiconductor material layers 18. Of course, they may have any desired number of fins, i.e., one or more. As indicated in view Z-Z of FIG. 1R, the overall gate width (GW) of the tri-gate FinFET devices 10 is normal to a horizontal surface 12S of the substrate 12. The gate length direction (GL) of the devices 10 is depicted in the plan view and the view X-X of FIG. 1Q. The gate length direction of the devices extends into and out of the drawing page in view Z-Z of FIG. 1R. It should also be noted that although the gate structure 50 is depicted as being terminated in the dashed-line regions 22X, in practice, the gate structure 50 will extend laterally above the isolation material 15 for a sufficient distance such that a gate contact structure (not shown) can be formed above the portion of the gate structure 50 positioned above the isolation material 15. Additionally, although not depicted in the drawings, at this point in the process flow, if desired, the gate structure 50 could be cut in the area indicated in dashed-line region 53 (see FIG. 1Q plan view) by performing traditional masking and etching processes. Thereafter the formation of the cap layer 52 would effectively seal the cut ends of the gate structure. In this manner, separate FinFET devices each with a dedicated gate structure could be formed.

Figure 1S:
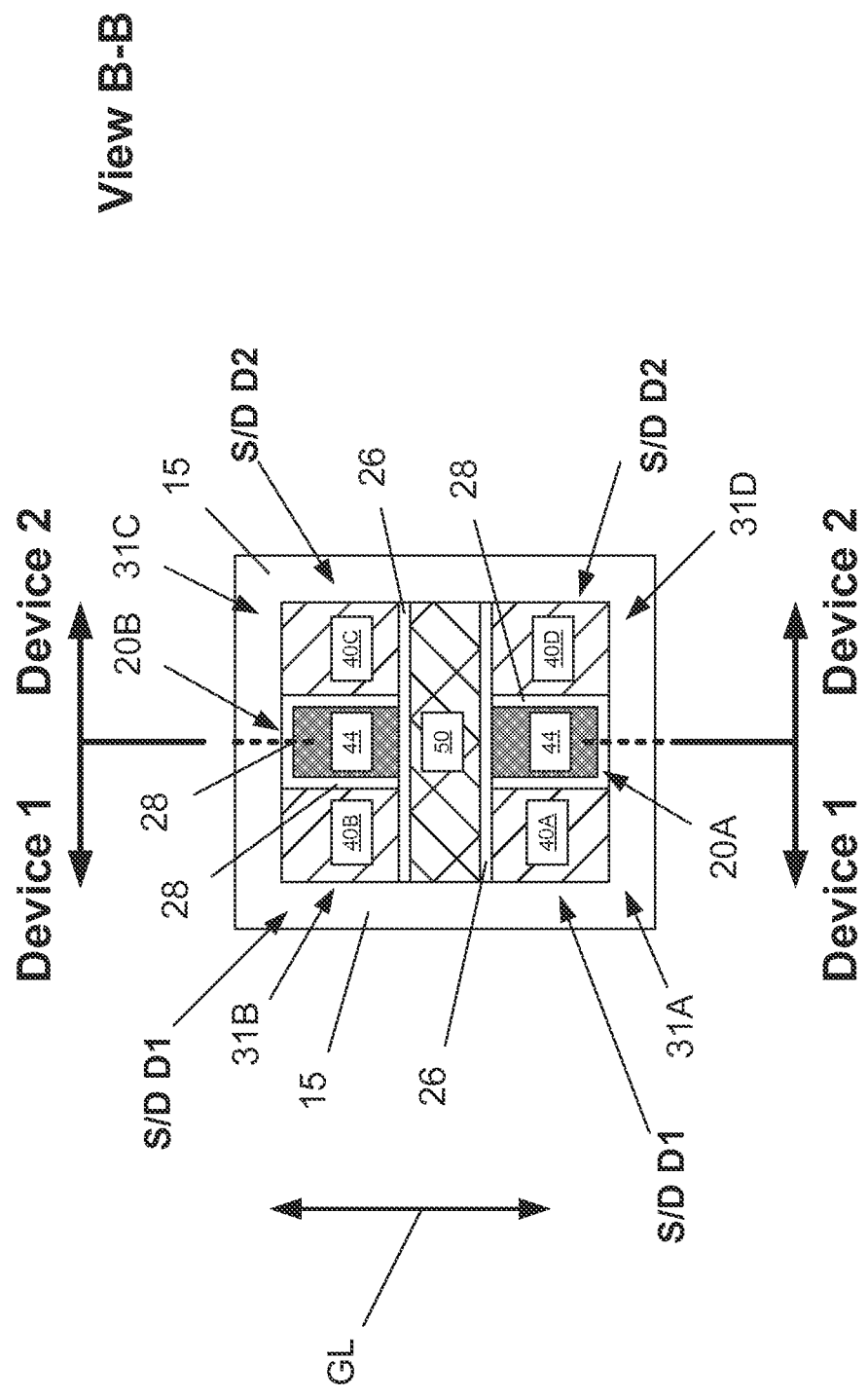

FIG. 1S is a cross-sectional plan view taken where indicated in FIG. 1Q, view Y-Y, i.e., at a level that cuts through the final gate structure 50. The overall gate length direction (GL) of the devices 10 is depicted in FIG. 1S. The overall gate width direction (GW) of the devices 10 extends into and out of the drawing page in FIG. 1S. As shown in FIG. 1S, the epi semiconductor materials 40A and 40B are the source/drain regions for the first device (D1), while the epi semiconductor materials 40C and 40D are the source/drain regions for the second device (D2). The insulation material 44 in the openings 20A, 20B electrically separate the source/drain regions of the two devices. The inventions disclosed herein have been disclosed in the context of forming two illustrative tri-gate FinFET devices 10. However, as will be appreciated by those skilled in the art after a complete reading of the present application, any number of such devices may be formed using the methods disclosed herein.

The previous drawings depict an embodiment wherein both of the devices 10 have the same number of fins under the gate structure, i.e., three fins 18A-18C, as shown in view Z-Z of FIG. 1R. However, the methods disclosed herein provide great flexibility so as to enable device designers to form different tri-gate FinFET devices 10 each having a different desired number of fins under the gate structures. One illustrative technique for doing so will be described with reference to FIGS. 1T-1X.

FIG. 1T depicts the devices 10 at a point in process after that shown in FIG. 1P, i.e., after the semiconductor materials 16 and the active layer 12A were selectively removed to define the above-described replacement gate cavity 47. After the replacement gate cavity 47 was formed, a masking material 51, e.g., OPL, was formed in and above the replacement gate cavity 47. FIG. 1U is a cross-sectional view taken where indicated in FIG. 1T, i.e., through the gate structure.

Figure 1W:
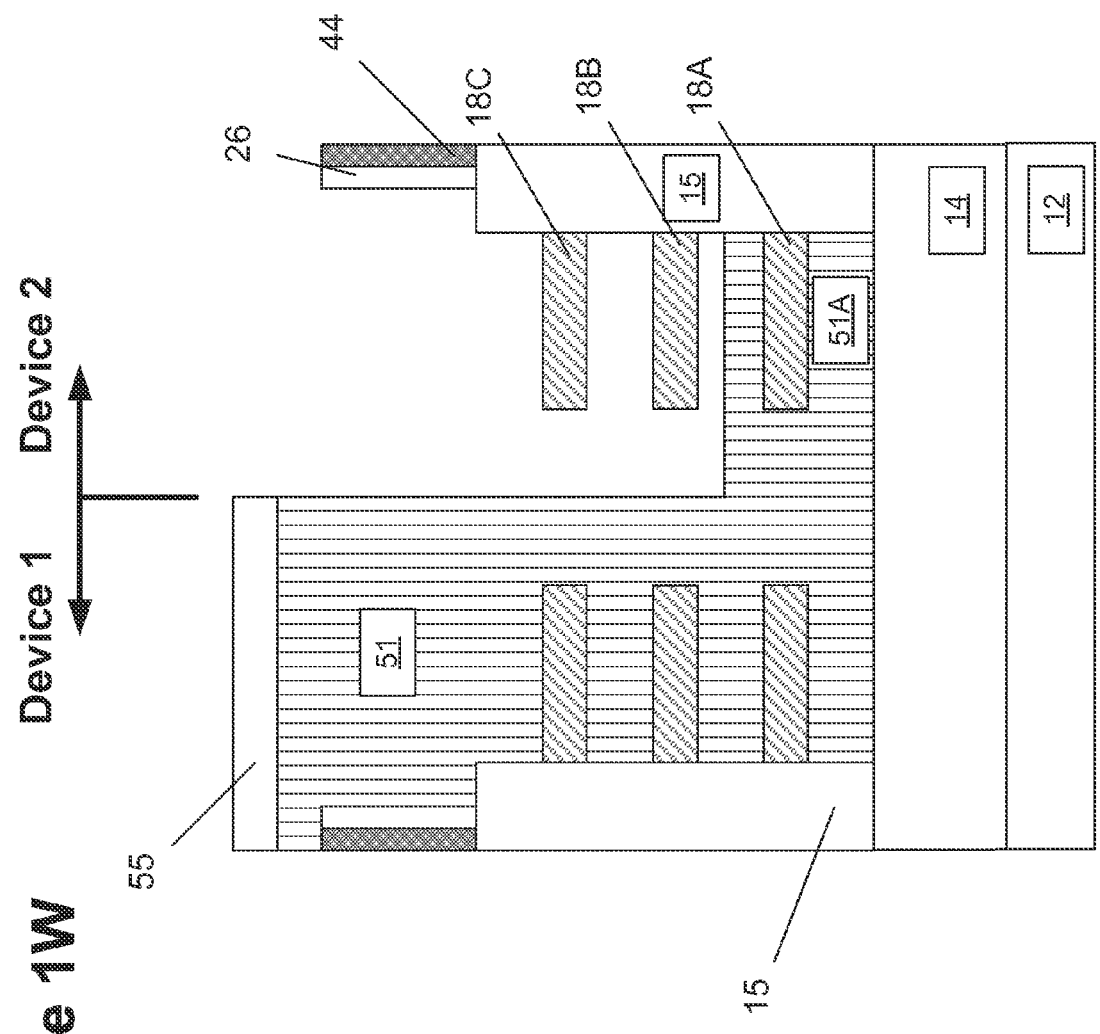

The next process operation will be described with reference to FIGS. 1V and 1W. FIG. 1W is a cross-sectional view taken where indicated in the plan view of FIG. 1V. Note that the location of the "Y-Y" cross-section has been moved such that there is a new cross-section "Y1-Y1" that is taken only through Device 2. As depicted in these drawings, a patterned masking layer 55, e.g., a patterned photoresist mask, was formed so as to cover Device 1 while exposing Device 2. Thereafter, a timed recess etching process was performed to remove some of the exposed masking material 51 from above Device 2 and from within the exposed portion of the gate cavity 47 in the Device 2 area (see view Y1-Y1 of FIG. 1V and FIG. 1W). This results in a recessed masking material 51A positioned in the replacement gate cavity 47 for Device 2. As depicted, the recessing of the masking material 51 within the replacement gate cavity 47 results in the exposure of the fins 18B and 18C for Device 2, while fin 18A for Device 2 remains covered by the recessed masking material 51A. As shown, all of the fins 18A-C remain covered in the gate cavity 47 for Device 1.

Figure 1X:
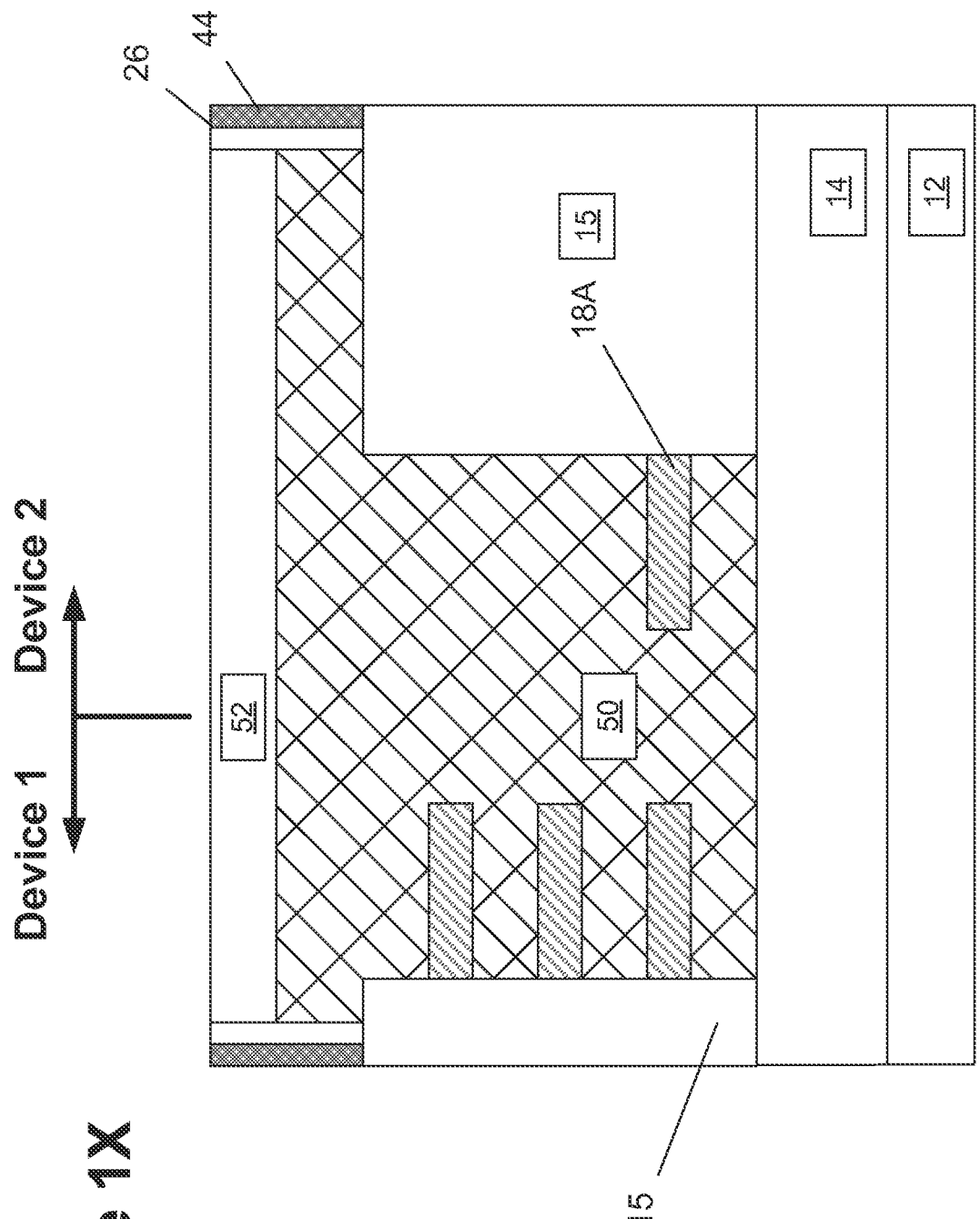

FIG. 1X is a cross-sectional view of the devices 10 taken through the gate structure 50. In this example, FIG. 1X depicts the tri-gate FinFET devices 10 after several process operations were performed. First, an etching process was performed through the recessed masking material 51 to remove the exposed fins 18B and 18C from within the replacement gate cavity 47 above Device 2. Thereafter, the patterned masking layer 55 was removed and then all of remaining masking material 51 was removed from the entire gate cavity 47. Next, the above-described final gate structure 50 and gate cap layer 52 were formed in the gate cavity 47. Note that, in this example, the gate structure 50 is depicted as extending a sufficient lateral distance above the isolation material 15 so as to allow formation of a gate contact structure (not shown) to the gate structure 50. As depicted, using this novel process flow, Device 1 was formed with three fins, while Device 2 was formed with 1 fin. This process can, of course, be extended to allow for formation of any desired number of fins for each of the devices 10.

Figures 3A, 3B, 3C:
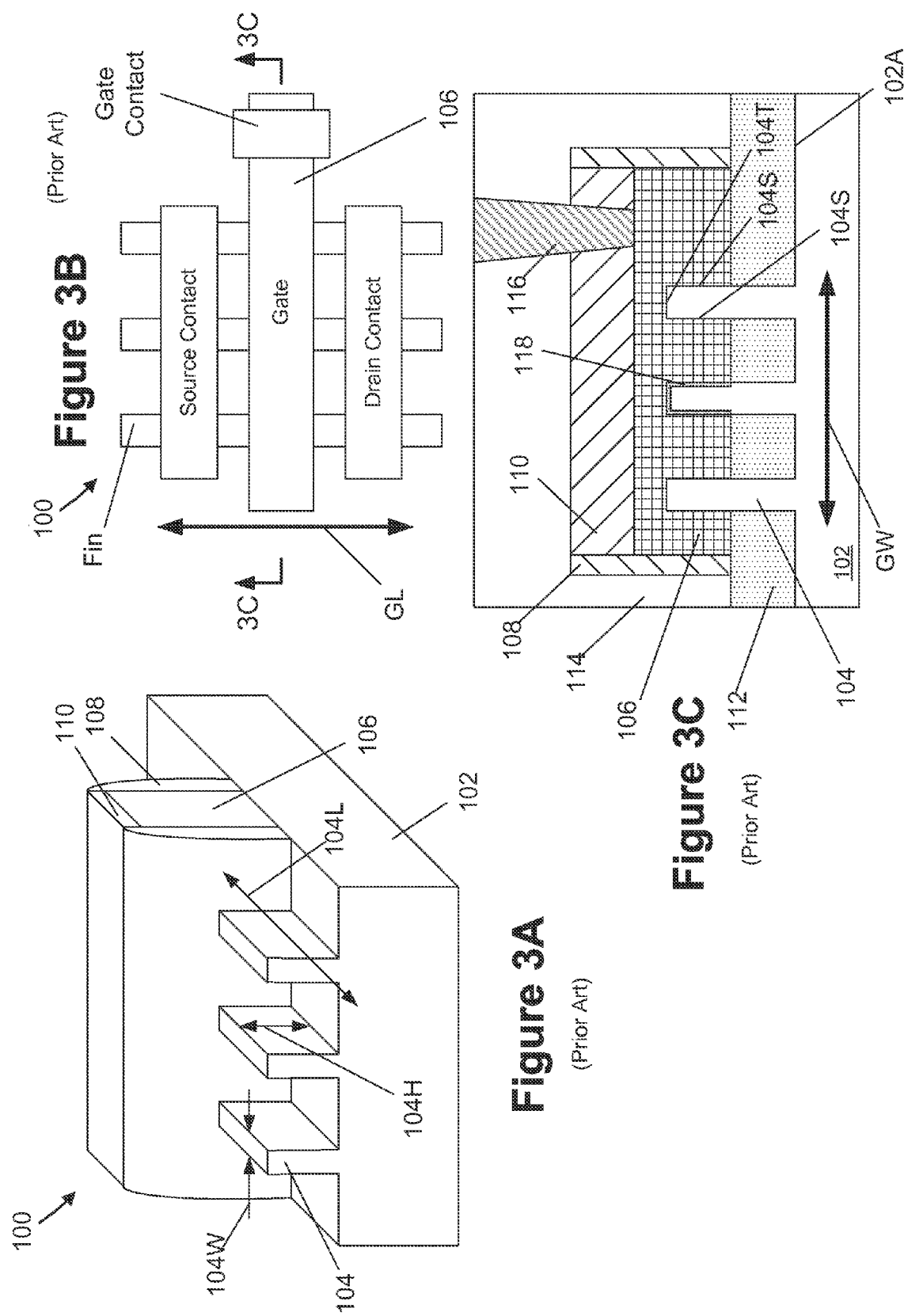
FIGS. 3A-3C depict an illustrative prior art FinFET device.

As will be appreciated by those skilled in the art after a complete reading of the present application, the tri-gate FinFET device disclosed herein is very different from traditional FinFET devices 100 (as described in the background section of this application) in terms of its structure and the methods in which it may be manufactured. For example, the FinFET devices disclosed herein are comprised of one or more horizontally oriented fins that are vertically positioned above and spaced apart from the substrate. With reference to FIG. 1R, view Z-Z, the fins 18 under the gate structure 50 have a height FH and a width FW. In the devices disclosed herein, the long axis 64 of the fins 18 in the height direction of the fins 18 is substantially horizontal and parallel to a horizontal surface 12S of the substrate 12. In contrast, the height direction 104H of the fins 104 at least under the gate structure 106 for the prior art device 100 disclosed in FIG. 3A is substantially normal to a horizontal surface of the substrate 102. Additionally, in the devices disclosed herein, the width direction FW of the fins 18 under the gate structure 50 is substantially normal to the horizontal surface 12S of the substrate 12. In contrast, the width direction 104W of the fins 104 for the prior art device 100 disclosed in FIG. 3A is substantially horizontal and parallel to a horizontal surface of the substrate 102. In the devices disclosed herein, each of the fins 18 is a horizontally oriented structure that is vertically spaced apart from the substrate 12. Each of the fins 18 has a first side surface or bottom surface 60, a second side surface 61, an upper surface 62 and a lower surface 63. The first side surface 60 of the fins 18 contacts the insulating material 15 while the gate structure 50 is positioned around the other surfaces 61, 62 and 63 of the fins 18. As depicted, the gate structure 50 (i.e., the gate insulation layer (not separately shown) contacts the insulating material 15 as well. Lastly, the long axis SOL (FIG. 1Q, view X-X) of the gate structure 50 is oriented substantially normal to the horizontal surface 12S of the substrate 12. In contrast, the long axis of the gate structure 106 for the prior art device 100 disclosed in FIG. 3A is substantially horizontal and parallel to a horizontal surface of the substrate 102.

FIGS. 2A-2F depict several illustrative products that may be formed using the methods disclosed herein.

Figure 2B:
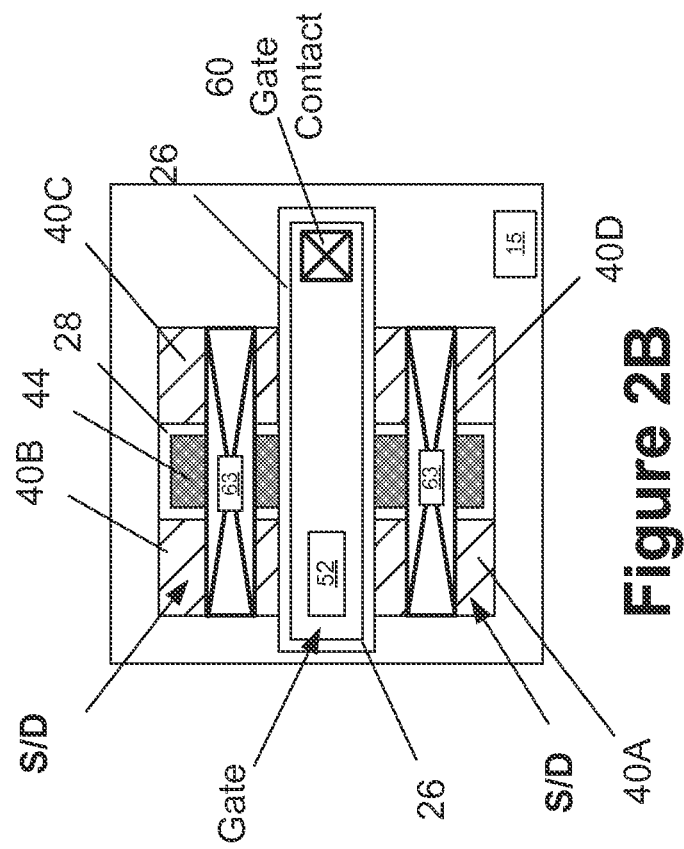
FIGS. 2A-2F depict various novel and illustrative products and devices that may be formed using the methods and devices disclosed herein.
Figure 2A:
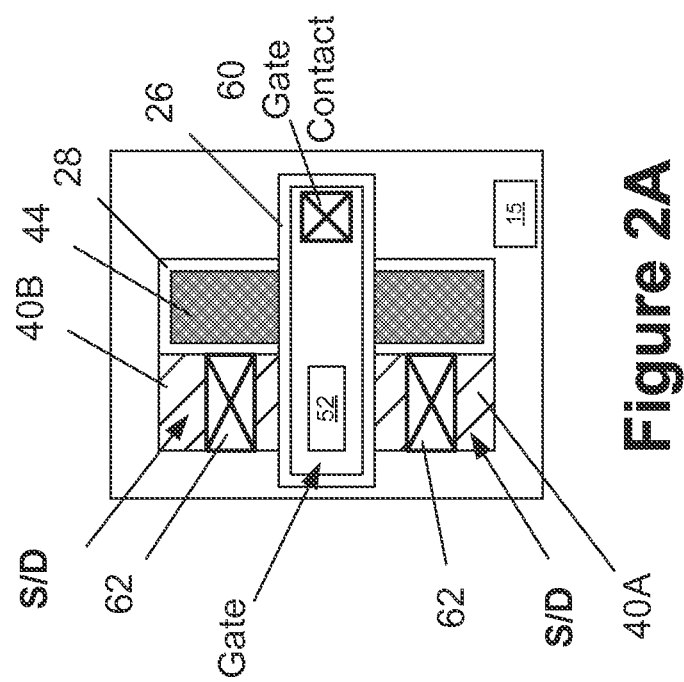

FIG. 2A depicts a single tri-gate FinFET device that is comprised of a single stack of horizontally oriented fins under the gate structure 50 (not shown as they are positioned under the gate structure). Also depicted are an illustrative gate contact 60 and a plurality of illustrative source/drain contact structures 62 in the form of trench silicide regions. In the case where the device shown in FIG. 2A is the above-described Device 1, the source/drain contact structures 62 would make contact to the underlying source/drain regions 40A-40B. Or course, various insulation materials in which the contact structures 62 and the gate contact 60 are formed are not depicted in FIG. 2A.

FIG. 2B depicts another embodiment of a single tri-gate FinFET device that is comprised on multiple stacks of horizontally oriented fins (not shown as they are positioned under the gate structure) separated by the isolation material 44. In this example, a single gate structure is conductively coupled to both of the stacked fins on opposite sides of the isolation material 44. Also depicted is a plurality of illustrative source/drain contact structures 63 in the form of trench silicide regions.

Figure 2C:
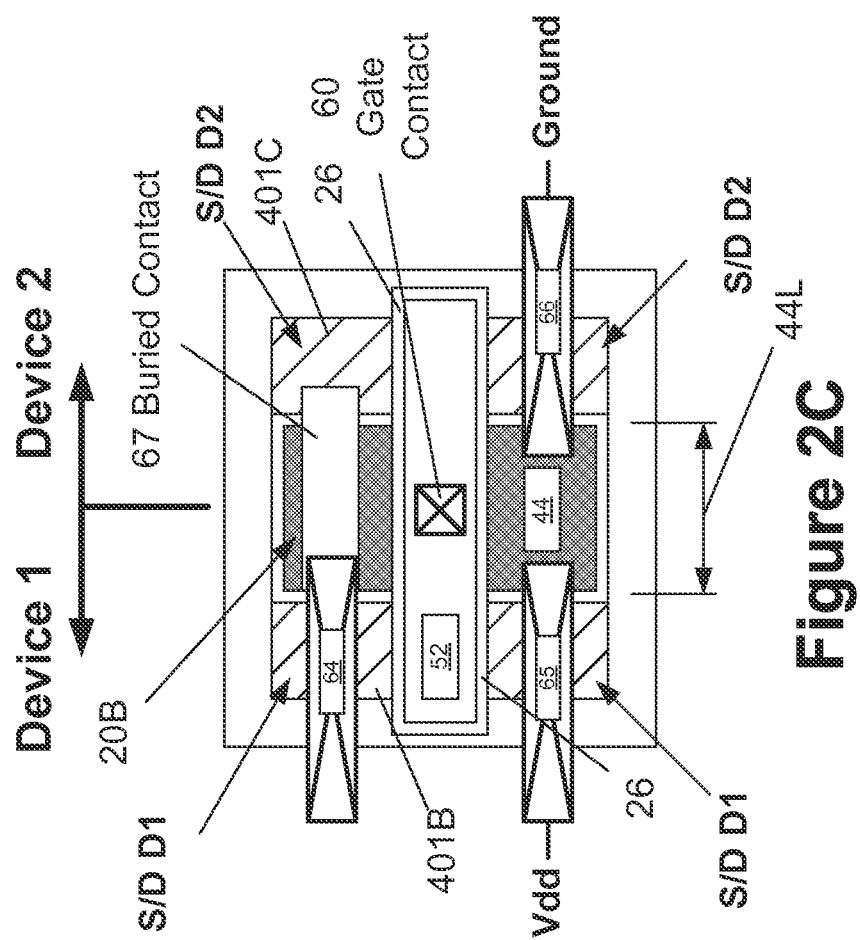

FIG. 2C depicts an illustrative inverter integrated circuit that may be formed using the methods and devices disclosed herein. In this example, a buried contact structure 67 is formed in the layer of insulating material. The buried contact structure 67 is electrically coupled to a source/drain region (S/D D1) of the Device 1 and a source/drain region (S/D D2) of the Device 2. A contact structure 64 (CA) is conductively coupled to the buried contact structure 67. Another contact structure 65 (CA) is conductively coupled to the other source/drain region (S/D D1) of Device 1 and coupled to drain voltage (Vdd). Yet another contact structure 66 (CA) is conductively coupled to the other source/drain region (S/D D2) of Device 2 and coupled to ground. As depicted, the lateral width 44L of the isolation region may be set to any desired value to accommodate any desired contact arrangement.

Figure 2D:
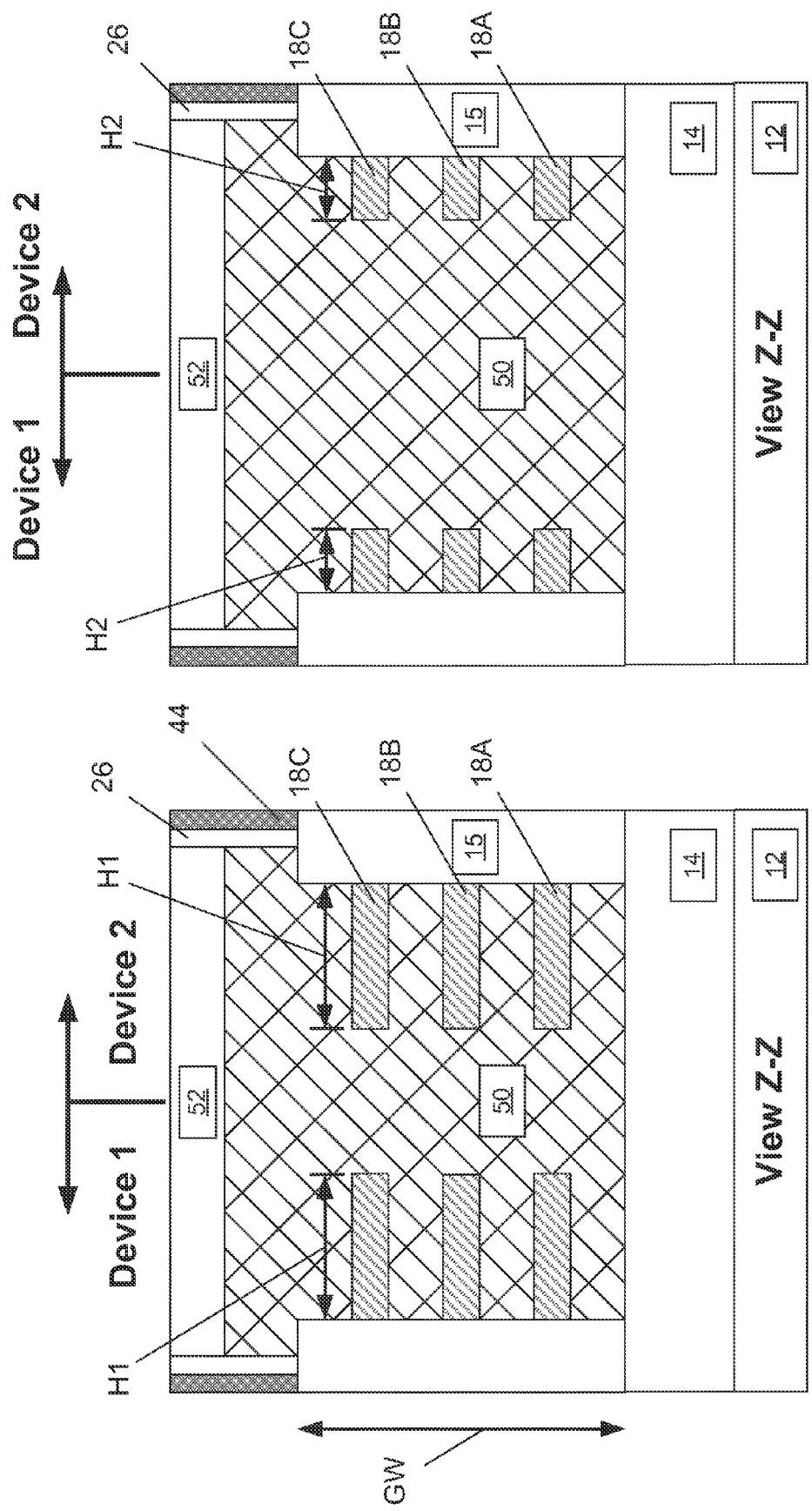

FIG. 2D depicts an example wherein tri-gate FinFET devices 10 intended for different applications, e.g., logic and SRAM, may be formed such that the height dimensions H1 and H2 are different for the devices used for the different applications. More specifically, for the two devices on the left side in FIG. 2D, the fins (for the logic application) under the gate structure 50 have a height H1 that is greater than the height of the fins H2 for the two devices on the right side in FIG. 2D that are formed for an SRAM application. The height differences may be set at the time the stack of materials 19 is patterned (FIG. 1D). That is, the greater the lateral dimension 20L of the opening 20, the less will be the height of the resulting fins.

Figure 2E:
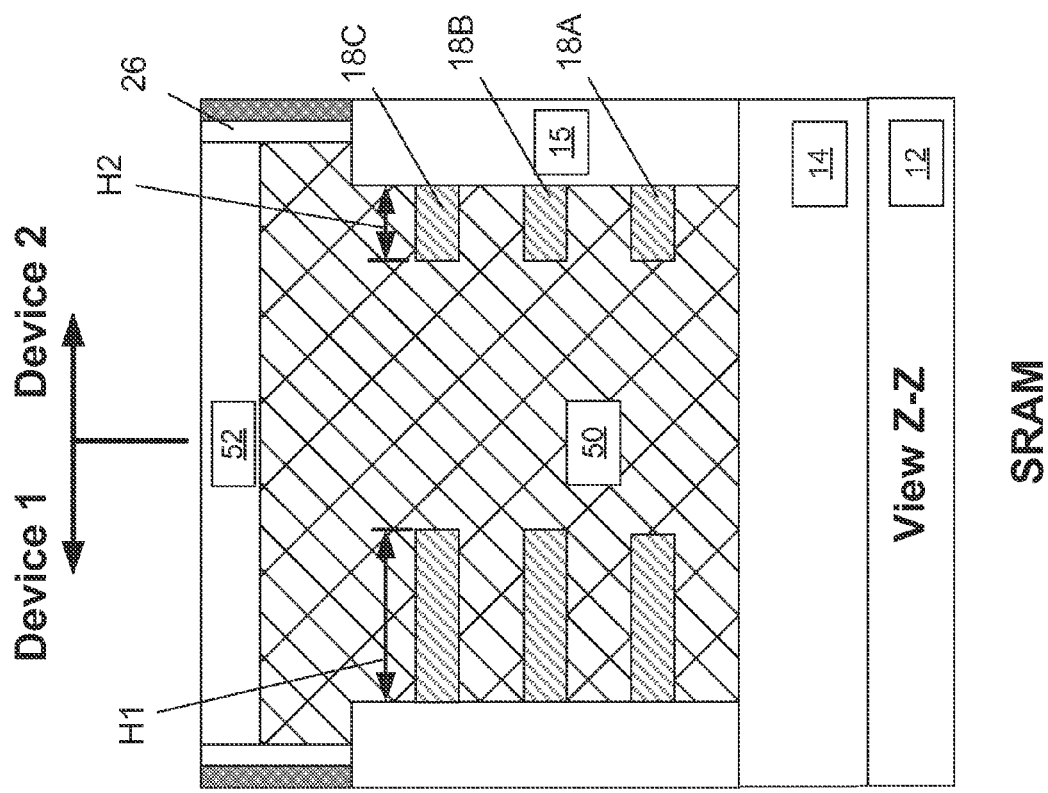

FIG. 2D depicts the situation where the stack of horizontally oriented fins under the gate structure in each of the two cases (logic and SRAM) all had the same height, i.e., all of the fins for both devices for the SRAM application all have the same height H2. However, the method disclosed herein may also be employed to form the devices such that they each have a stack of fins with different height fins. As depicted in FIG. 2E, the fins under the gate structure 50 for Device 1 have a height H1 that is greater than the height H2 of the fins under the gate structure for Device 2. This may also be accomplished when patterning the material stack 19 (see FIG. 1D). That is, rather than performing the patterning of the stack of materials 19 such that the resulting stacks 19A, 19B have the same lateral width 19L, which results in the two devices 10 having fins with the same height, the patterning operation may be performed such that the patterned lateral width 19L (e.g., equal to H1) of the first patterned stack 19A is greater (e.g., equal to H1) than the patterned lateral width 19L (e.g., equal to H2) of the second patterned stack 19B.

Figure 2F:
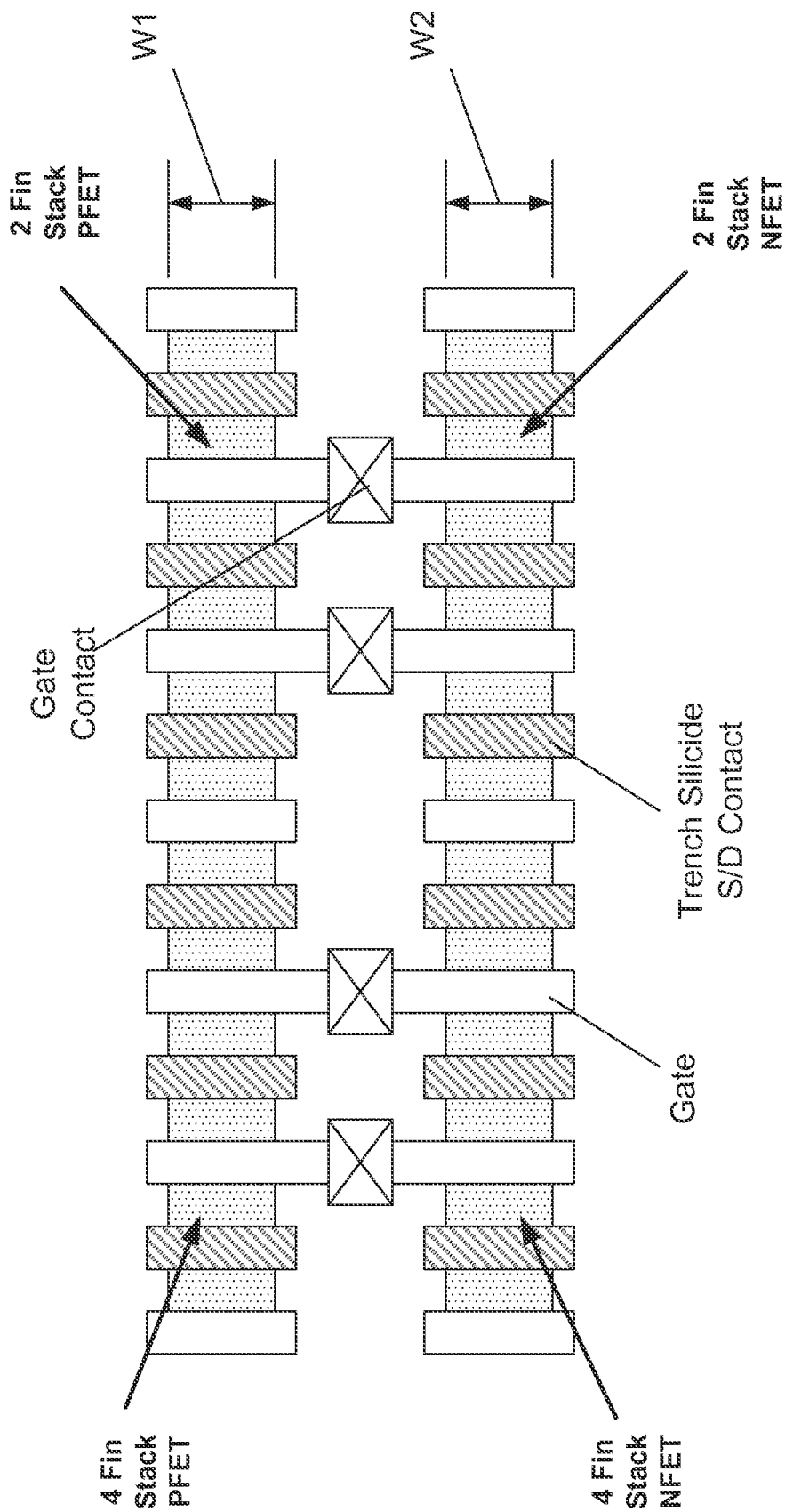
Figure 4:
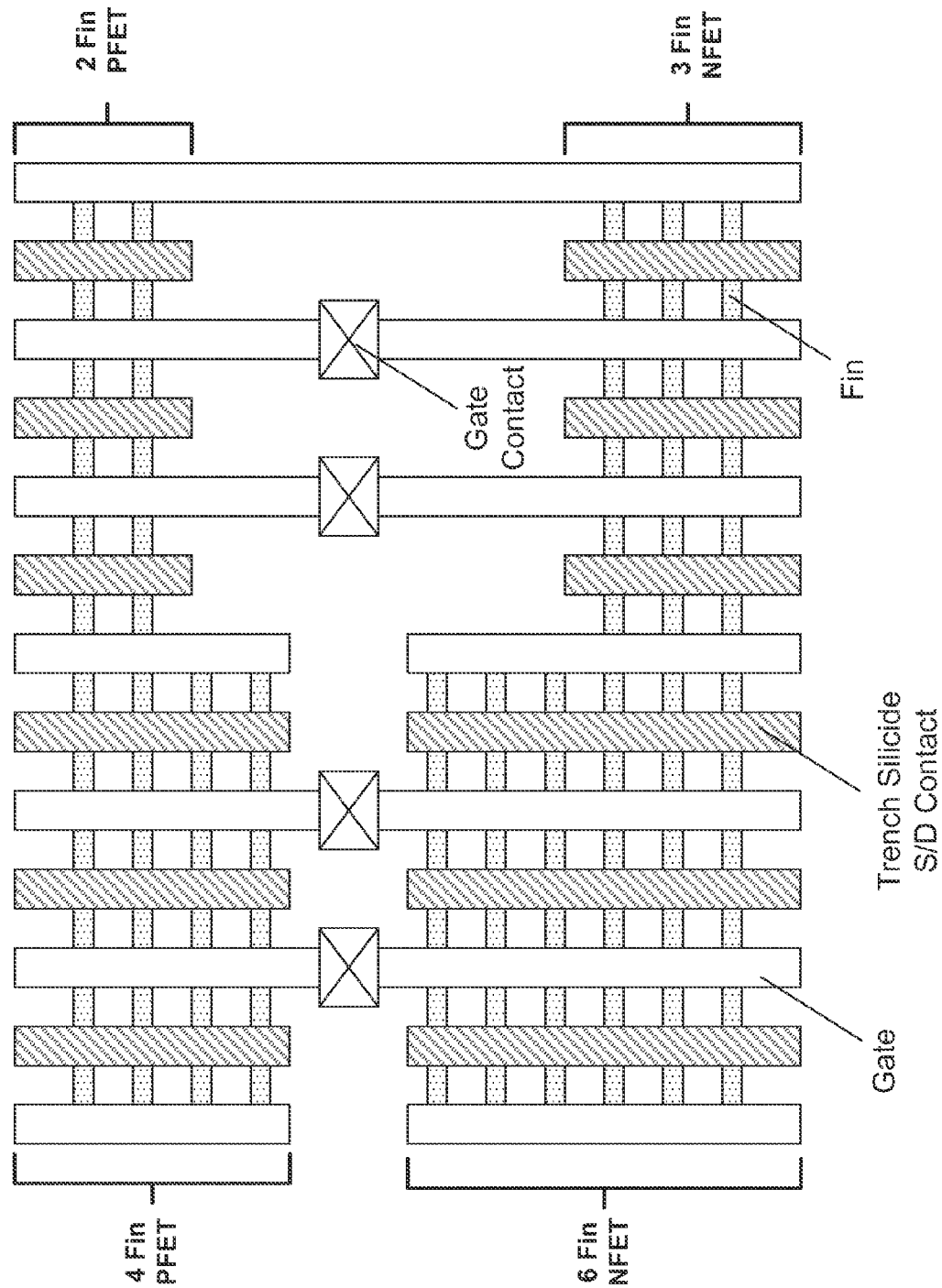
FIG. 4 depicts an illustrative prior art integrated circuit product comprised of a plurality of traditional prior art FinFET devices.

FIG. 2F is a depiction of the prior art logic device of FIG. 4 that is made by forming a plurality of the novel FinFET devices 10 disclosed herein. More specifically, the logic device is comprised of a 4-fin P-type FinFET device, a 2-fin P-type FinFET device, a 4-fin N-type FinFET device and a 2-fin N-type FinFET device. Various gate structures, gate contacts and trench silicide source/drain contact structures are also depicted. Due to the formation of the stacked, horizontally oriented fin structures under the gate structures 50, the FinFET devices disclosed herein have a much smaller foot-print as compared to the prior art integrated circuit formed using traditional prior-art FinFET semiconductor devices, as shown in FIG. 4. Accordingly, packing densities may be increased which leads to a reduction in the physical size of the overall integrated circuit product incorporating such devices. Due to the manner in which the devices herein are formed, the foot-print of the devices may be adjusted irrespective of the number of fins 18 in each device. For example, in one embodiment, when viewed from above, the "height" of the fins for the devices disclosed herein may be selected to be FH1 and FH2 for different devices formed in different regions of the substrate 12. In one particular example, FH1 and FH2 may be selected such that the ratio of FH2 to FH1 (FH2:FH1) is equal to 3:2. This flexibility provides significant advantages relative to the traditional prior art FinFET devices like those described in the present application. Due to the construction of the devices disclosed herein, and in particular the orientation of the "height" direction of the fin being substantially parallel to the upper surface of the substrate 12, the height of the fins of the devices disclosed herein may be set at any desired value. For example, a 4-fin device made using the structures and methods disclosed herein may be formed with the fins having a relatively longer "height" dimension (or "taller" fins) as compared to a traditional 6-fin device with relatively shorter fins (wherein the "height" direction is substantially normal to the substrate) wherein the 4-fin device disclosed herein is essentially equivalent to prior art 6-fin device (for a FH2:FH1 ratio of 3:2). Importantly, using the methods disclosed herein, the "height" of the fins may be adjusted between NFET and PFET devices without requiring the use of any additional masks. Masking is only required when forming devices with different numbers of fins. Lastly, since the fins formed on prior art FinFET devices were formed by etching trenches into a substrate, the resulting fins had a tapered cross-sectional profile, which created several problems including difficulties in removing one or a few fins to make room for isolation structures. In the devices disclosed herein, the fins are substantially planar layers of material that do not need to be removed after formation to allow room for formation of isolation regions.

Additionally, as noted above, the number of fins in a particular stack of fins may be varied across the surface of the substrate by using traditional masking and epi formation processes. For example, if devices A, B and C are to have 1, 3 and 6 fins each, respectively, the materials to form 6 fins may be formed across the entire substrate 12. Thereafter, the region where devices A and B will be formed are masked with a hard mask layer, e.g., silicon nitride, and the materials for the fins 4-6 may be selectively removed in the regions where devices A and B will be formed. Next, another hard mask layer may be formed so as to cover the regions where devices B and C will be formed while exposing the region where the device A will be formed. Thereafter, the materials for fins 2-3 may be removed from the region where device A will be formed. A similar masking and selective epi formation process may be performed to manufacture fins 18 of different materials for NFET and PFET devices. Thus, the methods disclosed herein provide device designers with great flexibility in designing FinFET devices that may be specifically tailored to meet the needs of the particular integrated circuit product being designed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a tri-gate FinFET device, comprising:
    forming a fin that is positioned above and vertically spaced apart from an upper surface of a semiconductor substrate, said fin having an upper surface, a lower surface opposite of said upper surface, a first side surface, and a second side surface opposite of said first side surface, wherein an axis of said fin in a height direction of said fin is oriented substantially parallel to said upper surface of said substrate, and wherein an entirety of said first side surface of said fin contacts and is completely covered by a first insulating material that is formed above said semiconductor substrate and laterally adjacent to said first side surface of said fin;
    forming a gate structure around said fin, wherein said gate structure covers at least a portion of said upper surface, said second side surface and said lower surface of said fin but does not cover any portion of said first side surface of said fin; and
    forming a gate contact structure that is conductively coupled to said gate structure.

2. The method of claim 1, wherein said gate structure contacts said first insulating material.

3. The method of claim 1, wherein forming said fin above and vertically spaced apart from said upper surface of said semiconductor substrate comprises:
    performing a plurality of deposition processes to form a stack of semiconductor materials comprised of alternating layers of first and second semiconductor materials above a second insulating material comprising said semiconductor substrate;
    patterning said stack of semiconductor materials;
    forming a sacrificial gate structure above said patterned stack of semiconductor materials;
    forming a sidewall spacer adjacent said sacrificial gate structure;
    removing said sacrificial gate structure so as to define a cavity that exposes said patterned stack of semiconductor materials within said cavity; and
    performing a selective etching process through said cavity to selectively remove said first semiconductor material relative to said second semiconductor material so as to thereby define said fin comprised of said second semiconductor material and a replacement gate cavity.

4. The method of claim 3, wherein forming said gate structure comprises depositing a gate insulation layer and at least one layer of metal in said replacement gate cavity.

5. The method of claim 3, wherein performing said plurality of deposition processes comprises performing at least one epitaxial deposition process.

6. The method of claim 3, wherein performing said plurality of deposition processes comprises performing at least one chemical vapor deposition process.

7. The method of claim 1, further comprising performing at least one epitaxial deposition process to form source/drain regions comprised of epi semiconductor material, wherein said fin serves as a template material for the formation of said epi semiconductor material.

8. The method of claim 1, wherein a long axis of said gate structure is oriented substantially normal to said upper surface of said substrate.

9. The method of claim 1, wherein an overall gate width direction of said device is oriented substantially normal to said upper surface of said substrate and an overall gate length direction of said device is substantially parallel to said upper surface of said substrate.

10. The method of claim 1, wherein a width of said fin is defined by a distance between said upper and lower surfaces of said fin and a fin width direction is substantially normal to said upper surface of said substrate.

11. The method of claim 1, wherein said fin is a first fin, the method further comprising forming a second fin that is positioned between and vertically spaced apart from said first fin and said semiconductor substrate, said second fin having an upper surface, a lower surface and first and second side surfaces, wherein an axis of said second fin in a height direction of said second fin is oriented substantially parallel to said first fin, wherein an entirety of a first side surface of said second fin contacts and is completely covered by said first insulating material, and wherein said gate structure covers at least a portion of said upper surface, said second side surface and said lower surface of said second fin but does not cover any portion of said first side surface of said second fin.

12. A method of forming a tri-gate FinFET device, comprising:
    performing a plurality of deposition processes to form a stack of semiconductor materials comprised of alternating layers of first and second semiconductor materials above a first insulating material comprising a semiconductor substrate;
    patterning said stack of semiconductor materials;
    forming a sacrificial gate structure above said patterned stack of semiconductor materials;
    forming a sidewall spacer adjacent said sacrificial gate structure;
    removing said sacrificial gate structure so as to define a cavity that exposes said patterned stack of semiconductor materials within said cavity;
    performing a selective etching process through said cavity to selectively remove said first semiconductor material relative to said second semiconductor material so as to thereby define a fin comprised of said second semiconductor material and a replacement gate cavity vertically spaced apart from an upper surface of said semiconductor substrate, said fin having an upper surface, a lower surface opposite of said upper surface, a first side surface, and a second side surface opposite of said first side surface, wherein an axis of said fin in a height direction of said fin is oriented substantially parallel to said upper surface of said substrate, and wherein an entirety of a first side surface of said fin contacts and is completely covered by a second insulating material that is formed above said semiconductor substrate and laterally adjacent to said first side surface of said fin;
    forming a gate structure in said replacement gate cavity around said fin, wherein said gate structure covers at least a portion of said upper surface, said second side surface and said lower surface of said fin but does not cover any portion of said first side surface of said fin; and forming a gate contact structure that is conductively coupled to said gate structure.

13. The method of claim 12, wherein said gate structure contacts said second insulating material.

14. The method of claim 12, wherein forming said gate structure comprises depositing a gate insulation layer and at least one layer of metal in said replacement gate cavity.

15. The method of claim 12, further comprising performing at least one epitaxial deposition process to form source/drain regions comprised of epi semiconductor material, wherein said fin serves as a template material for the formation of said epi semiconductor material.

16. The method of claim 12, wherein a long axis of said gate structure is oriented substantially normal to said upper surface of said substrate.

17. The method of claim 12, wherein an overall gate width direction of said device is oriented substantially normal to said upper surface of said substrate and an overall gate length direction of said device is substantially parallel to said upper surface of said substrate.

18. The method of claim 12, wherein a width of said fin is defined by a distance between said upper and lower surfaces of said fin and a fin width direction is substantially normal to said upper surface of said substrate.

19. The method of claim 12, wherein said fin is a first fin and wherein performing said selective etching process through said cavity further comprises defining a second fin that is positioned between and vertically spaced apart from said first fin and said semiconductor substrate, said second fin having an upper surface, a lower surface and first and second side surfaces, wherein an axis of said second fin in a height direction of said second fin is oriented substantially parallel to said first fin, wherein an entirety of a first side surface of said second fin contacts and is completely covered by said second insulating material, and wherein said gate structure covers at least a portion of said upper surface, said second side surface and said lower surface of said second fin but does not cover any portion of said first side surface of said second fin.

20. The method of claim 12, wherein performing said plurality of deposition processes comprises performing at least one epitaxial deposition process.

21. The method of claim 12, wherein performing said plurality of deposition processes comprises performing at least one chemical vapor deposition process.

\* \* \* \* \*